US012759265B2

(12) United States Patent
Kobayashi et al.

(10) Patent No.: US 12,759,265 B2
(45) Date of Patent: Oct. 13, 2026

(54) FRONT PANEL FOR DISPLAY DEVICE, FLEXIBLE ORGANIC ELECTROLUMINESCENCE DISPLAY DEVICE, STACKED BODY FOR DISPLAY DEVICE, AND STACKED BODY

(71) Applicant: DAI NIPPON PRINTING CO., LTD., Tokyo (JP)

(72) Inventors: Atsuhiro Kobayashi, Tokyo (JP); Yousuke Kousaka, Tokyo (JP); Takayuki Fukuda, Tokyo (JP); Kazuya Honda, Tokyo (JP); Kana Yamamoto, Tokyo (JP); Yoshimasa Ogawa, Tokyo (JP); Jun Sato, Tokyo (JP); Gen Furui, Tokyo (JP); Keisuke Yamada, Tokyo (JP); Saori Kawaguchi, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 940 days.

(21) Appl. No.: 17/762,306

(22) PCT Filed: Sep. 28, 2020

(86) PCT No.: PCT/JP2020/036676
§ 371 (c)(1),
(2) Date: Mar. 21, 2022

(87) PCT Pub. No.: WO2021/060559
PCT Pub. Date: Apr. 1, 2021

(65) Prior Publication Data

US 2022/0367832 A1 Nov. 17, 2022

(30) Foreign Application Priority Data

Sep. 27, 2019 (JP) ................................ 2019-177179
Mar. 31, 2020 (JP) ................................ 2020-064107

(51) Int. Cl.
*H01L 51/52* (2006.01)
*B32B 7/022* (2019.01)
(Continued)

(52) U.S. Cl.
CPC .............. *B32B 17/10* (2013.01); *B32B 7/022* (2019.01); *B32B 7/12* (2013.01); *B32B 27/08* (2013.01);
(Continued)

(58) Field of Classification Search
CPC .. H01L 51/524; H10K 50/841; H10K 59/871; H10K 2102/311; H10K 77/111;
(Continued)

(56) References Cited

U.S. PATENT DOCUMENTS

2005/0077826 A1* 4/2005 Watanabe ............... B32B 27/36 313/587
2017/0192462 A1* 7/2017 Kim ........................ B32B 27/36
2021/0011337 A1 1/2021 Ueki et al.

FOREIGN PATENT DOCUMENTS

JP 2008143931 A * 6/2008
JP 2019-065287 4/2019
(Continued)

*Primary Examiner* — Ermias T Woldegeorgis
(74) *Attorney, Agent, or Firm* — HSML P.C.

(57) ABSTRACT

The present disclosure provides a front panel for a display device comprising a substrate layer, an A layer, an impact absorbing layer, and a B layer, in this order, wherein a shear storage elastic modulus of the A layer and the B layer, at frequency of 950 Hz and temperature of 23° C., is 20 MPa or less, and in the impact absorbing layer, a tensile storage elastic modulus at frequency of 950 Hz and temperature of 23° C. is 200 MPa or more and 5000 MPa or less, and a glass transition temperature is 50° C. or more.

7 Claims, 4 Drawing Sheets

(51) Int. Cl.

| | |
|---|---|
| ***B32B 7/12*** | (2006.01) |
| ***B32B 17/10*** | (2006.01) |
| ***B32B 27/08*** | (2006.01) |
| ***B32B 27/28*** | (2006.01) |
| ***B32B 27/30*** | (2006.01) |
| ***B32B 27/36*** | (2006.01) |
| ***B32B 27/40*** | (2006.01) |
| ***C08F 220/30*** | (2006.01) |
| ***C08F 222/10*** | (2006.01) |
| ***C08J 5/18*** | (2006.01) |
| ***C08J 7/04*** | (2020.01) |
| ***C08J 7/046*** | (2020.01) |
| ***H05K 5/03*** | (2006.01) |
| ***H10K 59/80*** | (2023.01) |
| *H10K 102/00* | (2023.01) |

(52) U.S. Cl.

CPC .......... *B32B 27/281* (2013.01); *B32B 27/283* (2013.01); *B32B 27/308* (2013.01); *B32B 27/36* (2013.01); *B32B 27/40* (2013.01); *C08F 220/301* (2020.02); *C08F 222/104* (2020.02); *C08F 222/1065* (2020.02); *C08J 5/18* (2013.01); *C08J 7/042* (2013.01); *C08J 7/046* (2020.01); *H05K 5/03* (2013.01); *H10K 59/871* (2023.02); *B32B 2250/03* (2013.01); *B32B 2250/04* (2013.01); *B32B 2250/24* (2013.01); *B32B 2255/10* (2013.01); *B32B 2255/26* (2013.01); *B32B 2270/00* (2013.01); *B32B 2307/308* (2013.01); *B32B 2307/412* (2013.01); *B32B 2307/51* (2013.01); *B32B 2307/54* (2013.01); *B32B 2307/542* (2013.01); *B32B 2307/558* (2013.01); *B32B 2309/105* (2013.01); *B32B 2315/08* (2013.01); *B32B 2333/08* (2013.01); *B32B 2367/00* (2013.01); *B32B 2375/00* (2013.01); *B32B 2379/08* (2013.01); *B32B 2383/00* (2013.01); *B32B 2457/206* (2013.01); *B32B 2457/208* (2013.01); *C08J 2333/08* (2013.01); *H10K 2102/311* (2023.02)

(58) Field of Classification Search

CPC .......... H05B 33/02; H05K 5/03; B32B 7/022; B32B 7/12; B32B 17/10; B32B 27/08; B32B 27/281; B32B 27/283; B32B 27/308; B32B 27/36; B32B 27/40; B32B 2250/03; B32B 2250/04; B32B 2250/24; B32B 2255/10; B32B 2255/26; B32B 2270/00; B32B 2307/308; B32B 2307/412; B32B 2307/51; B32B 2307/54; B32B 2307/542; B32B 2307/558; B32B 2309/105; B32B 2315/08; B32B 2333/08; B32B 2367/00; B32B 2375/00; B32B 2379/08; B32B 2383/00; B32B 2457/206; B32B 2457/208; B32B 27/00; B32B 27/06; B32B 7/027; B32B 17/1077; B32B 17/10779; B32B 2457/20; C08F 220/301; C08F 222/104; C08F 222/1065; C08J 5/18; C08J 7/042; C08J 7/046; C08J 2333/08; Y02E 10/549; G02B 1/14; G02B 1/04; G09F 9/00; G09F 9/30; G09F 9/33; C09D 175/14; C09D 151/08

See application file for complete search history.

(56) References Cited

FOREIGN PATENT DOCUMENTS

| | | | |
|---|---|---|---|
| JP | 2019119084 A | * | 7/2019 |
| JP | 2019-532356 | | 11/2019 |
| WO | 2018/057774 | | 3/2018 |
| WO | 2019/225631 | | 11/2019 |

* cited by examiner

FRONT PANEL FOR DISPLAY DEVICE, FLEXIBLE ORGANIC ELECTROLUMINESCENCE DISPLAY DEVICE, STACKED BODY FOR DISPLAY DEVICE, AND STACKED BODY

TECHNICAL FIELD

The present disclosure relates to a front panel for a display device, a flexible organic electroluminescence display device, a stacked body for a display device, and a stacked body.

BACKGROUND ART

In recent years, a front panel used for a flexible display such as a foldable display, a rollable display, or a bendable display has been actively developed.

The front panel protects display device from an impact and a scratch, and is required to have, for example, strength, impact resistance, scratch resistance. Further, for the front panel for a flexible display, flexibility such as folding property (foldable), winding property (rollable), and bending property (bendable), is also required. Therefore, in the front panel for a flexible display, the thickness of a substrate layer tends to be reduced. However, if the thickness of the substrate layer is reduced, impact resistance may be lowered. Therefore, it has been proposed to stack an impact absorbing layer on the substrate layer (for example, Patent Document 1).

Also in the flexible display, although it is not the front panel, for an optical pressure-sensitive adhesive sheet, in order to improve the bending resistance of the optical pressure-sensitive adhesive sheet, an optical filler bonding material including a hard layer having a shear elastic modulus within a predetermined range, and a soft layer having shear elastic modulus within a predetermined range, has been proposed (Patent Document 2).

CITATION LIST

Patent Documents

Patent Document 1: Japanese Patent Application Laid-Open (JP-A) No. 2019-532356

Patent Document 2: JP-A No. 2019-65287

SUMMARY OF DISCLOSURE

Technical Problem

Although the impact resistance may be improved in a front panel wherein an impact absorbing layer is tacked on a substrate layer, further improvement of the impact resistance is required.

The present disclosure has been made in view of the above circumstances, and a main object of the present disclosure is to provide a front panel for a display device excellent in impact resistance, a flexible organic electroluminescence display device comprising the same, a stacked body for a display device used for the same, and a stacked body.

Solution to Problem

In order to solve the problems, the inventors of the present disclosure have intensively studied, and as the result, they have focused on the hardness of the layers constituting the front panel. Thus, it was found out that impact resistance may be improved by using a layer softer than the impact absorbing layer, and stacking the substrate layer, the soft layer, the impact absorbing layer, and the soft layer, in this order. Further, the inventors of the present disclosures have repeatedly investigated and found out that, by setting the glass transition temperature of the impact absorbing layer to a predetermined range, a high impact resistance and flexibility may be maintained regardless of the environmental temperature. The present disclosure is based on such findings.

One embodiment of the present disclosure provides a front panel for a display device comprising a substrate layer, an A layer, an impact absorbing layer, and a B layer, in this order, wherein a shear storage elastic modulus of the A layer and the B layer, at frequency of 950 Hz and temperature of 23° C., is 20 MPa or less, and in the impact absorbing layer, a tensile storage elastic modulus at frequency of 950 Hz and temperature of 23° C. is 200 MPa or more and 5000 MPa or less, and a glass transition temperature is 50° C. or more.

In the front panel for a display device in the present disclosure, it is preferable that a ratio of a tensile storage elastic modulus of the substrate layer at frequency of 950 Hz and temperature of 23° C., with respect to the tensile storage elastic modulus of the impact absorbing layer is 1.5 or more.

Also, in the front panel for a display device in the present disclosure, it is preferable that the substrate layer is a polyimide based resin substrate or a glass substrate.

Also, in the front panel for a display device in the present disclosure, it is preferable that the impact absorbing layer includes a urethane based resin or a polyethylene terephthalate based resin.

Another embodiment of the present disclosure provides a flexible organic electroluminescence display device comprising: an organic electroluminescence display panel, and the front panel for a display device described above placed on an observer side of the organic electroluminescence display panel.

Another embodiment of the present disclosure provides a stacked body for a display device used for a front panel for a display device, comprising an A layer, an impact absorbing layer, and a B layer, in this order, wherein a shear storage elastic modulus of the A layer and the B layer, at frequency of 950 Hz and temperature of 23° C., is 20 MPa or less, and in the impact absorbing layer, a tensile storage elastic modulus at frequency of 950 Hz and temperature of 23° C. is 200 MPa or more and 5000 MPa or less, and a glass transition temperature is 50° C. or more.

Another embodiment of the present disclosure provides a stacked body comprising an A layer, an impact absorbing layer, and a B layer, in this order, wherein a shear storage elastic modulus of the A layer and the B layer, at frequency of 950 Hz and temperature of 23° C., is 20 MPa or less, the impact absorbing layer includes a urethane based resin, and in the impact absorbing layer, a tensile storage elastic modulus at frequency of 950 Hz and temperature of 23° C. is 200 MPa or more and 5000 MPa or less, and a glass transition temperature is 50° C. or more.

Advantageous Effects of Disclosure

The present disclosure has an effect that a front panel for a display device excellent in impact resistance may be provided.

DESCRIPTION OF EMBODIMENTS

Embodiments in the present disclosure are hereinafter explained with reference to, for example, drawings. However, the present disclosure is enforceable in a variety of different forms, and thus should not be taken as is limited to the contents described in the embodiments exemplified as below. Also, the drawings may show the features of the present disclosure such as width, thickness, and shape of each part schematically comparing to the actual form in order to explain the present disclosure more clearly in some cases; however, it is merely an example, and thus does not limit the interpretation of the present disclosure. Also, in the present description and each drawing, for the factor same as that described in the figure already explained, the same reference sign is indicated and the detailed explanation thereof may be omitted.

In the present descriptions, in expressing an aspect wherein some member is placed on the other member, when described as merely "on" or "below", unless otherwise stated, it includes both of the following cases: a case wherein some member is placed directly on or directly below the other member so as to be in contact with the other member, and a case wherein some member is placed on the upper side or the lower side of the other member via yet another member. Also, in the present descriptions, on the occasion of expressing an aspect wherein some member is placed on the surface of the other member, when described as merely "on the surface side" or "on the surface", unless otherwise stated, it includes both of the following cases: a case wherein some member is placed directly on or directly below the other member so as to be in contact with the other member, and a case wherein some member is placed on the upper side or the lower side of the other member via yet another member.

A front panel for a display device, a flexible organic electroluminescence display device, a stacked body for a display device, and a stacked body in the present disclosure are hereinafter described in detail.

A. Front Panel for a Display Device

The front panel for a display device in the present disclosure comprises a substrate layer, an A layer, an impact absorbing layer, and a B layer, in this order, wherein a shear storage elastic modulus of the A layer and the B layer, at frequency of 950 Hz and temperature of 23° C., is 20 MPa or less, and in the impact absorbing layer, a tensile storage elastic modulus at frequency of 950 Hz and temperature of 23° C. is 200 MPa or more and 5000 MPa or less, and a glass transition temperature is 50° C. or more.

Figure 1:
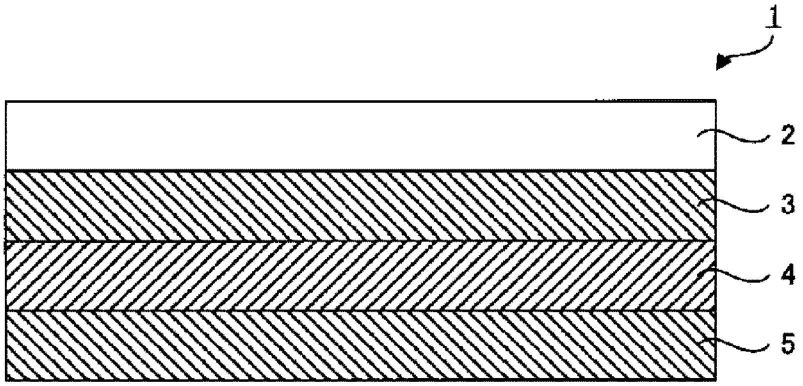
FIG. 1 is a schematic cross-sectional view illustrating an example of a front panel for a display device in the present disclosure.

FIG. 1 is a schematic cross-sectional view illustrating an example of a front panel for a display device in the present disclosure. As shown in FIG. 1, front panel for a display device 1 comprises substrate layer 2, A layer 3, impact absorbing layer 4, and B layer 5, in this order. The A layer 3 and the B layer 5 have a predetermined shear storage elastic modulus, and the impact absorbing layer 4 has predetermined tensile storage elastic modulus, and glass transition temperature.

In the front panel for a display device in the present disclosure, by including the impact absorbing layer, when an impact is applied to the front panel for a display device, the impact is absorbed by the impact absorbing layer so that impact resistance may be improved.

Also, when the substrate layer is a glass substrate, crack of the glass substrate may be suppressed.

Further, in addition to the effects described above, when the front panel for a display device in the present disclosure is used for a rollable display, shear stress generated between the inner side and the outer side of the display device when it is winded, may be relieved, exhibiting an effect that various problems caused by shearing stress during winding, may be reduced.

Here, according to JIS K 7244-4:1999 (Plastic—Method for testing dynamic mechanical properties, Section 4: Tensile vibration—non-resonant method), the method for measuring tensile storage elastic modulus is suitable for a measurement of the dynamic storage elastic modulus in a range of 0.01 GPa to 5 GPa, and is able to measure up to approximately 10 GPa. Meanwhile, according to JIS K 7244-6:1999 (Plastic—Method for testing dynamic mechanical properties, Section 6: Shear vibration—non-resonant method), the method for measuring shear storage elastic modulus is suitable for a measurement of the dynamic storage elastic modulus in a range of 0.1 MPa to 50 MPa, and material with elastic modulus of 50 MPa or more may be measured. That is, for a relatively hard layer, tensile storage elastic modulus is suitable, and for a relatively soft layer, shear storage elastic modulus is suitable.

In the front panel for a display device in the present disclosure, the shear storage elastic modulus is specified for the A layer and the B layer, and the tensile storage elastic modulus is specified for the impact absorbing layer, and the A layer and the B layer may be referred to as relatively soft layers, and the impact absorbing layer may be referred to as a relatively hard layer.

Also, although it is not possible to directly compare the shear storage elastic modulus of the relatively soft layers, the A layer and the B layer, and the tensile storage elastic modulus of the relatively hard layer, the impact absorbing layer, a relationship between tensile storage elastic modulus E' and shear storage elastic modulus G' is generally represented by the following formula (1).

$$E' = 2(1+\nu)G' \tag{1}$$

(Here, in the formula (1), ʋ represent Poisson's ratio.) Since the Poisson's ratio ʋ for films and plastics is 0.3 to 0.4, the following relationship formula works out.

$$E' \geq 2(1+0.3)G' > 2G'$$

Since the tensile storage elastic modulus E' is more than twice of the shear storage elastic modulus G', it is obvious in the front panel for a display device in the present disclosure that the dynamic storage elastic modulus of the relatively hard layer, the impact absorbing layer, is larger than the dynamic storage elastic modulus of the relatively soft layers, the A layer and the B layer. Therefore, the A layer and the B layer may be referred to as layers softer than the impact absorbing layer.

According to the present disclosure, impact resistance may further be improved, by placing the impact absorbing layer between the A layer and the B layer, those are softer than the impact absorbing layer. This is believed that higher impact absorbing effect may be exhibited, since the A layer and the B layer are softer than the impact absorbing layer and easier to be deformed, the deformation of the impact absorbing layer is not suppressed by the A layer and the B layer when an impact is applied to the front panel for a display device, so that the impact absorbing layer is easily deformed.

Also, since the front panel for a display device in the present disclosure is excellent in impact resistance, it is possible to make the thickness of the substrate layer thinner so that high flexibility may be realized. Therefore, the front panel for a display device in the present disclosure may be used as a front panel in, for example, a flexible display such as a foldable display, a rollable display, and a bendable display.

Further, in the present disclosure, by the glass transition temperature of the impact absorbing layer being a predetermined value or more, the condition of the material included in the impact absorbing layer is not changed immediately in the environmental temperature so that excellent impact resistance and flexibility may be maintained regardless of the environment temperature.

Each constitution of the front panel for a display device in the present disclosure is hereinafter described.

1. Impact Absorbing Layer

The impact absorbing layer in the present disclosure is a member having a predetermined tensile storage elastic modulus and glass transition temperature; is placed between the A layer and the B layer; has impact resistance; and has transparency.

The tensile storage elastic modulus of the impact absorbing layer at frequency of 950 Hz and temperature of 23° C. may be 200 MPa or more and 5000 MPa or less, preferably 250 MPa or more and 4000 MPa or less, more preferably 300 MPa or more and 2000 MPa or less, and particularly preferably 300 MPa or more and 1000 MPa or less. If the tensile storage elastic modulus of the impact absorbing layer is too high, the impact absorbing layer becomes hard, and when an impact is applied to the front panel for a display device, the impact absorbing layer hardly absorbs the impact, and the impact absorbing performance may be deteriorated.

Further, when the tensile storage elastic modulus of the impact absorbing layer is too low, the impact absorbing layer becomes too soft, and when an impact is applied to the front panel for a display device, the impact absorbing layer is easily deformed so that there is a possibility that a member such as display panel, placed on the inner side than the front panel for a display device in the display device, may be damaged before the impact absorbing layer absorbs enough impact. Therefore, the thickness of the impact absorbing layer is increased in order to maintain the strength, so that the thickness of the front panel for a display device as a whole is increased, and there is a possibility that the flexibility is impaired.

Here, for the tensile storage elastic modulus of the impact absorbing layer at frequency of 950 Hz and temperature of 23° C., the tensile storage elastic modulus at frequency of 950 Hz and temperature of 23° C. is measured for three times, and the arithmetic average value of the three measurement values is obtained.

Incidentally, the reason why the frequency is set to 950 Hz is that this frequency is included in a frequency range wherein the surface of a front panel for a display device is deformed for several μm to several tens of μm, when the object is fallen freely from a height of several cm, and is included in a frequency range wherein a member such as display panel, placed on the inner side than the front panel for a display device in the display device, is damaged.

Here, the tensile storage elastic modulus E' of the impact absorbing layer may be measured with a dynamic mechanical analyzing device (DMA). When the tensile storage elastic modulus E' of the impact absorbing layer is measured with a dynamic mechanical analyzing device (DMA), firstly, an impact absorbing layer is punched into a rectangular shape of 40 mm×5 mm to obtain a measurement sample. Then, this measurement sample is installed into a tensile measuring jig of the dynamic mechanical analyzing device. Specifically, the measuring jig is provided with a chuck jig that sandwiches a film, at the top and bottom respectively, one end of the rectangular measurement sample is fixed by the upper chuck, the other end is fixed by the lower chuck, so as the pulling direction is the longitudinal direction of the measurement sample.

At this time, the distance between the chucks is 20 mm, and the measurement sample is adjusted and fixed so as not to slack and not to be excessively pulled. Thereafter, a tensile load (static load) is applied in an environment at a temperature of 23° C., and longitudinal vibrations at a frequency of 950 Hz are applied by a tensile method (sine wave distortion, tensile modes, strain amounts: auto-distortion) to measure the tensile storage elastic modulus E'. As the dynamic mechanical analyzing device, for example, a Rheogel-E4000 from UBM Corporation may be used. Incidentally, specific measurement conditions in the method described above are shown below.

(Measurement Conditions of Tensile Storage Elastic Modulus)

- Measurement sample: 40 mm×5 mm rectangle
- Measuring jig: pull
- Distance between chucks (measurement sample length between chucks): 20 mm
- Distortion waveform: sine wave
- Distortion control: automatic adjustment
- Frequency: 950 Hz
- Temperature: 23° C.
- Static load control: 50 g (constant static load).

However, when the distance between chucks is extended by 2 mm or more at the time of load application, the load was reduced to 10 g (constant static load) or 5 g (constant static load).

Also, when measuring the tensile storage elastic modulus of the impact absorbing layer, the measurement is carried out after peeling the substrate layer, the A layer, and the B layer off from the impact absorbing layer. The peeling off of the substrate layer, the A layer, and the B layer may be carried out, for example, in the following manner. Firstly, the front panel for a display device is heated with a dryer. The cutting edge of a cutter is inserted into the portion where seems to be the interface between the impact absorbing layer and the other layers, and peeled off slowly. By repeating such heating and peeling, the substrate layer, the A layer, and the B layer may be peeled off from the impact absorbing layer. Incidentally, even if there is such a peeling step, there is no significant influence on the measurement.

The glass transition temperature of the impact absorbing layer may be 50° C. or more, preferably 60° C. or more, more preferably 80° C. or more. Further, the glass transition temperature of the impact absorbing layer may be, for example, 200° C. or less. By the glass transition temperature of the impact absorbing layer being within the above range, the condition of the material included in the impact absorbing layer is not changed immediately in the environmental temperature so that excellent flexibility may be maintained regardless of the environment temperature.

Here, the glass transition temperature of the impact absorbing layer means a value measured by a method based on the peak-top value of the tensile loss tangent (tan δ) (DMA method). When measuring the tensile storage elastic modulus E', the tensile loss elastic modulus E" and the tensile loss tangent tan δ of the impact absorbing layer by the dynamic mechanical analyzing device (DMA), firstly an impact absorbing layer is punched into a rectangular shape of 40 mm×5 mm to obtain a measurement sample. Then, this measurement sample is installed into a tensile measuring jig of the dynamic mechanical analyzing device. Specifically, the measuring jig is provided with a chuck jig that sandwiches a film, at the top and bottom respectively, one end of the rectangular measurement sample is fixed by the upper chuck, the other end is fixed by the lower chuck, so as the pulling direction is the longitudinal direction of the measurement sample.

At this time, the distance between the chucks is 20 mm, and the measurement sample is adjusted and fixed so as not to slack and not to be excessively pulled. Then, while applying a tensile load (static load), vibrations at a frequency of 1 Hz are applied, the dynamic mechanical analysis is carried out in a range of −50° C. or more and 200° C. or less, and the tensile storage elastic modulus E', the tensile loss elastic modulus E" and the tensile loss tangent tan δ of the impact absorbing layer are measured at respective temperatures. The glass transition temperature of the impact absorbing layer is the temperature at which the tensile loss tangent tan δ peaks within a range of −50° C. or more and 200° C. or less. Incidentally, the reason why the frequency is set to 1 Hz is that the folding operation of a flexible display is an operation of this frequency range, so that damages to the flexible display by the folding test may be checked. As the dynamic mechanical analyzing device, for example, a Rheogel-E4000 from UBM Corporation may be used. Incidentally, specific measurement conditions in the above method are shown below.

(Measurement Conditions of Glass Transition Temperature)

- Measurement sample: 40 mm×5 mm rectangle
- Measuring jig: pull
- Distance between chucks (measurement sample length between chucks): 20 mm
- Measurement mode: temperature dependence (temperature range: −50° C. to 200° C., step temperature: 1° C., temperature rising rate: 2° C./min)
- Distortion waveform: sine wave
- Distortion control: automatic adjustment
- Frequency: 1 Hz (continuous vibration applying)
- Static load control: 50 g (constant static load).

However, when the distance between chucks is extended by 2 mm or more at the time of load application, the load was reduced to 10 g (constant static load) or 5 g (constant static load).

The impact absorbing layer has transparency. Specifically, the total light transmittance of the impact absorbing layer is preferably, for example, 85% or more, more preferably 88% or more, and further preferably 90% or more. By having such high total light transmittance, a front panel for a display device having good transparency may be obtained.

Here, the total light transmittance of the impact absorbing layer may be measured according to JIS K7361-1, for example, with a haze meter HM150 from Murakami Color Research Laboratory Co., Ltd.

Also, the haze of the impact absorbing layer is preferably, for example, 5% or less, more preferably 2% or less, and further preferably 1% or less. By having such low haze, a front panel for a display device having good transparency may be obtained.

Here, the haze of the impact absorbing layer may be measured according to JIS K-7136, for example, with a haze meter HM150 from Murakami Color Research Laboratory Co., Ltd.

The material for the impact absorbing layer is not particularly limited as long as it is a material that satisfies the tensile storage elastic modulus and glass transition temperature described above and has transparency, and examples thereof may include a urethane based resin and a polyethylene terephthalate based resin. Among them, a urethane based resin is preferable. By using the urethane based resin, the tensile storage elastic modulus and the shear storage elastic modulus of the impact absorbing layer may be reduced among the above ranges, that is, the impact absorbing layer may be easily deformed and the impact absorbing performance may be enhanced.

The urethane based resin is a resin including a urethane bond. Examples of the urethane based resin may include a cured product of ionizing radiation curable urethane based resin composition and a cured product of thermosetting urethane based resin composition. Among them, the cured product of ionizing radiation curable urethane based resin composition is preferable from the viewpoint of obtaining a high hardness and excellent mass productivity at a fast curing rate.

The thermosetting urethane based resin composition may comprise, for example, a polyol compound and an isocyanate compound. The polyol compound and the isocyanate compound may be any one of monomers, oligomers, and prepolymers.

The ionizing radiation curable urethane based resin composition may comprise, for example, urethane (meth) acrylate. The urethane (meth) acrylate may be any one of monomers, oligomers, and prepolymers.

The number of (meth) acryloyl groups (number of functional groups) in the urethane (meth) acrylate is, for example, preferably two or more and four or less, and more preferably two or more and three or less. When the number of (meth) acryloyl groups in the urethane (meth) acrylate is small, the hardness may be low. Also, when the number of (meth) acryloyl groups in the urethane (meth) acrylate is large, the curing shrinkage may be large, and the impact absorbing layer may curl, and cracks may occur in the impact absorbing layer at the time of folding.

Incidentally, "(meth) acrylate" is meant to include both "acrylate" and "methacrylate", and "(meth) acryloyl group" is meant to include both "acryloyl group" and "methacryloyl group".

The weight average molecular weight of the urethane (meth) acrylate is, for example, preferably 1500 or more and 20000 or less, and more preferably 2000 or more and 15000 or less. When the weight average molecular weight of the urethane (meth) acrylate is too low, the impact resistance may be lowered. Also, when the weight average molecular weight of the urethane (meth) acrylate is too high, the viscosity of the ionizing radiation curable urethane based resin composition is increased so that the coatability may be deteriorated. Incidentally, the weight average molecular weight of the urethane (meth) acrylate refers to a value determined in terms of polystyrene measured with a gel permeation chromatography (GPC).

When the urethane based resin is a cured product of ionizing radiation curable urethane based resin composition, and when the ionizing radiation curable urethane based resin composition includes a urethane (meth) acrylate, the urethane based resin includes repeating units having a structure derived from the urethane (meth) acrylate. Examples of the repeating unit having a structure derived from the urethane (meth) acrylate may include structures represented by the following general formulas (1), (2), (3) or (4), for example.

[Chemical 1]

(1)

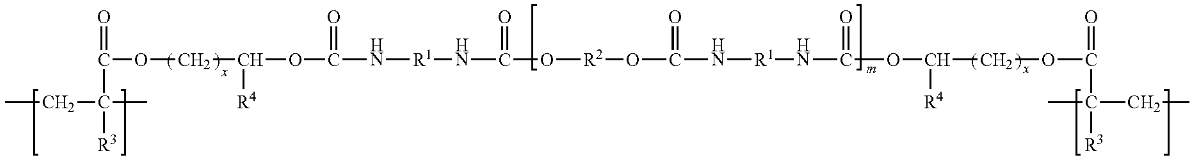

In the general formula (1), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "m" represents an integer of 0 or more; and "x" represents an integer of 0 to 3.

[Chemical 2]

(2)

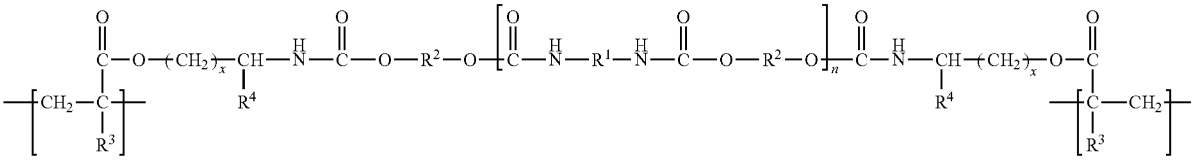

In the general formula (2), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "n" represents an integer of 1 or more; and "x" represents an integer of 0 to 3.

[Chemical 3]

(3)

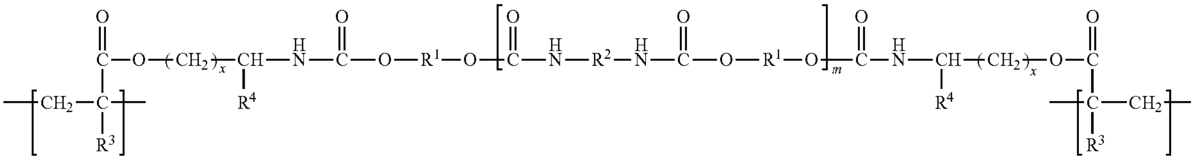

In the general formula (3), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "m" represents an integer of 0 or more; and "x" represents an integer of 0 to 3.

[Chemical 4]

(4)

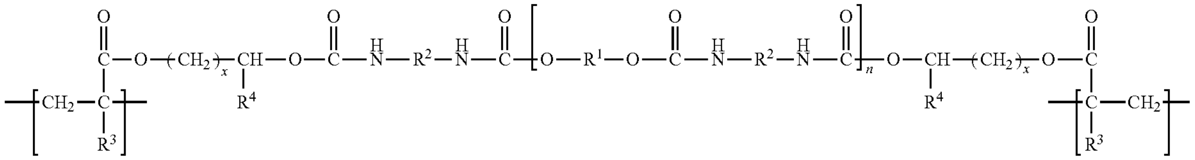

In the general formula (4), $R^1$ represents a branched chain alkyl group; $R^2$ represents a branched chain alkyl group or a saturated cyclic aliphatic group; $R^3$ represents a hydrogen atom or a methyl group; $R^4$ represents a hydrogen atom, a methyl group or an ethyl group; "n" represents an integer of 1 or more; and "x" represents an integer of 0 to 3.

Incidentally, what structural of polymer chains (repeating units) is the resin included in the impact absorbing layer formed by may be determined by analyzing the impact absorbing layer by, for example, pyrolysis gas chromatography mass spectrometry (GC-MS) and Fourier transform infrared spectroscopy (FT-IR). In particular, a pyrolysis GC-MS is useful since it may detect monomeric units included in the impact absorbing layer as monomeric components.

The impact absorbing layer may include, for example, an ultraviolet absorber, a spectroscopic transmittance modifier, an antifouling agent, inorganic particles, a leveling agent, and a polymerization initiator, according to the needs.

The thickness of the impact absorbing layer is not particularly limited as long as it has a thickness capable of exhibiting impact absorbing performance, and is preferably, for example, 50 μm or more and 150 μm or less, more preferably 70 μm or more and 120 μm or less, and further preferably 80 μm or more and 100 μm or less. When the thickness of the impact absorbing layer is too thin, sufficient impact absorbing performance may not be obtained. Also, when the thickness of the impact absorbing layer is too thick, flexibility may be impaired.

Here, the thickness of the impact absorbing layer may be the average value of the thickness of arbitrary 10 points obtained by measuring from the thickness directional cross-section of the front panel for a display device by observing with a transmission electron microscope (TEM), a scanning electron microscope (SEM) or a scanning transmission electron microscope (STEM). Incidentally, the same may be applied to the measuring methods of the thickness of other layers included in the front panel for a display device.

As the impact absorbing layer, for example, a film shaped impact absorbing layer may be used. Also, for example, a composition for an impact absorbing layer may be applied on a supporting member to form an impact absorbing layer.

2. A Layer and B Layer

The A layer and the B layer in the present disclosure have a predetermined shear storage elastic modulus, are placed on both sides of the impact absorbing layer respectively, and are members having transparency.

The shear storage elastic modulus of the A layer and the B layer at frequency of 950 Hz and temperature of 23° C. is 20 MPa or less, preferably 18 MPa or less, and more preferably 15 MPa or less. When the shear storage elastic modulus of the A layer and the B layer are in the above ranges, the layers may be softer than the impact absorbing layer. Therefore, when an impact is applied to the front panel for a display device, the impact absorbing layer may be easily deformed so that impact resistance may be improved. Also, the shear storage elastic modulus of the A layer and the B layer is preferably, for example, 0.05 MPa or more, more preferably 0.5 MPa or more, and further preferably 3 MPa or more. By the shear storage elastic modulus of the A layer and the B layer being within the above range and having a certain degree of hardness, the impact absorbing property may be enhanced.

The shear storage modulus of the A layer and the B layer may be the same or different from each other.

Here, for the shear storage elastic modulus of the A layer and B layer at frequency of 950 Hz and temperature of 23° C., the shear storage elastic modulus at frequency of 950 Hz and temperature of 23° C. is measured for three times, and the arithmetic average value of the three measurements is obtained.

Here, the shear storage elastic modulus G' of the A layer and the B layer may be measured with a dynamic mechanical analyzing device (DMA). When the shear storage elastic modulus G' of the A layer or the B layer is measured with the dynamic mechanical analyzing device (DMA), firstly, the A layer or the B layer is punched into a rectangular shape of 10 mm×5 mm to obtain a measurement sample. Then, two pieces of this measurement sample are prepared and installed into a solid shear jig of the dynamic mechanical analyzing device. Specifically, in the solid shear jig, three plates are provided in the vertical direction, that is, one metal inner plate having a thickness of 1 mm, and two L-shaped metal outer plates placed on both sides of the inner plate are provided; one of the measurement samples is sandwiched between the inner plate and one outer plate, and the other measurement sample is sandwiched between the inner plate and the other outer plate. Then, the solid shear jig is installed into a dynamic mechanical analyzing device at distance between chucks of 20 mm, and the shear storage elastic modulus G' is measured in an environment at a temperature of 23° C., applying longitudinal vibrations with a strain amount of 1% and frequency of 950 Hz to the two outer plates while fixing the pull inner plate. As the dynamic mechanical analyzing device, for example, a Rheogel- E4000 from UBM Corporation may be used. Incidentally, specific measurement conditions in the method described above are shown below.

(Measurement Conditions of Shear Storage Elastic Modulus)

Measurement sample: 10 mm×5 mm rectangle (two samples)
Measuring jig: solid shear
Distortion waveform: sine wave
Distortion control: automatic adjustment
Frequency: 950 Hz
Temperature: 23° C.

Also, the glass transition temperature of the A layer and the B layer is preferably 0° C. or more, and among them, preferably 35° C. or more, and particularly 55° C. or more. Also, the glass transition temperature of the A layer and the B layer may be, for example, 120° C. or less. By the glass transition temperature of the A layer and the B layer being within the above range, the condition of the material included in the A layer and the B layer is not changed immediately in the environmental temperature so that excellent flexibility may be maintained regardless of the environment temperature.

Here, the glass transition temperature of the A layer and the B layer is a value measured by a method based on the peak-top value of the shear loss tangent (tan δ) (DMA method). When measuring the shear storage elastic modulus G' of the A layer or the B layer by the dynamic mechanical analyzing device (DMA), firstly, the A layer or the B layer is punched into a rectangular shape of 10 mm×5 mm to obtain a measurement sample. Then, two pieces of this measurement sample are prepared and installed into a solid shear jig of the dynamic mechanical analyzing device. Specifically, in the solid shear jig, three plates are provided in the vertical direction, that is, one metal inner plate having a thickness of 1 mm, and two L-shaped metal outer plates placed on both sides of the inner plate are provided; one of the measurement samples is sandwiched between the inner plate and one outer plate, and the other measurement sample is sandwiched between the inner plate and the other outer plate. Then, the solid shear jig is installed into a dynamic mechanical analyzing device at distance between chucks of 20 mm, and the dynamic elastic modulus is measured at temperature within a range of −50° C. or more and 200° C. or less, applying longitudinal vibrations with a strain amount of 1% and frequency of 1 Hz to the two outer plates while fixing the pull inner plate, and the shear storage elastic modulus G' is measured at respective temperatures. As the dynamic mechanical analyzing device, for example, a Rheogel-E4000 from UBM Corporation may be used. Incidentally, specific measurement conditions in the method described above are shown below.

(Measurement Conditions of Glass Transition Temperature)

Measurement sample: 10 mm×5 mm rectangle (two samples)
Measuring jig: solid shear
Distortion waveform: sine wave
Distortion control: automatic adjustment
Frequency: 1 Hz
Measurement mode: temperature dependence (temperature range: −50° C. to 200° C., step temperature: 1° C., temperature rising rate: 2° C./min)

The material of the A layer and the B layer is not particularly limited as long as it a material that satisfies the shear storage elastic modulus described above and has transparency; and among them, a pressure-sensitive adhesive, that is, a pressure-sensitive adhesive (PSA) is preferable. Since the pressure-sensitive adhesive is relatively soft, by using the pressure-sensitive adhesive, the shear storage elastic modulus of the A layer and the B layer may be reduced so as to be in the above range.

The materials of the A layer and the B layer may be the same and may be different from each other.

The pressure-sensitive adhesive used for the A layer is not particularly limited as long as it satisfies the shear storage elastic modulus described above, has transparency, and able to adhere the impact absorbing layer and the substrate layer. Examples thereof may include an acryl based pressure-sensitive adhesive, a silicone based pressure-sensitive adhesive, a rubber based pressure-sensitive adhesive, and a urethane based pressure-sensitive adhesive, and may be selected as appropriate according to the materials of the impact absorbing layer and the substrate layer. Among them, an acryl based pressure-sensitive adhesive and a silicone based pressure-sensitive adhesive are preferable. This is because they are excellent in transparency, weather resistance, durability, and heat resistance, and are low in cost.

Also, the pressure-sensitive adhesive used for the B layer is not particularly limited as long as it satisfies the shear storage elastic modulus described above, has transparency, and is able to adhere the impact absorbing layer and an arbitrary layer placed on the B layer, on the opposite surface to the impact absorbing layer; and examples thereof may include an acryl based pressure-sensitive adhesive, a silicone based pressure-sensitive adhesive, a rubber based pressure-sensitive adhesive, and a urethane based pressure-sensitive adhesive; and may be selected as appropriate according to the material, for example, of the impact absorbing layer and the arbitrary layer. Among them, an acryl based pressure-sensitive adhesive and the silicone based pressure-sensitive adhesive are preferable. This is because they are excellent in transparency, weather resistance, durability, and heat resistance, and are low in cost.

The thickness of the A layer and the B layer may be preferably, for example, 10 μm or more and 100 μm or less, more preferably 25 μm or more and 80 μm or less, and further preferably 40 μm or more and 60 μm or less. When the thickness of the A layer and the B layer is too thin, the effect to make the impact absorbing layer easily deformed, may not be sufficiently obtained, when an impact is applied to the front panel for a display device. Also, when the thickness of the A layer and the B layer is too thick, flexibility may be impaired.

The thickness of the A layer and the B layer may be the same, and may be different from each other.

As the A layer and the B layer, for example, a film shaped A layer and B layer may be used. Also, for example, a composition for A layer or a composition for B layer may be applied on a supporting member or on the impact absorbing layer to form the layer A or the layer B.

3. Substrate Layer

The substrate layer in the present disclosure is a member configured to support the A layer, the impact absorbing layer and the B layer, and has transparency.

(1) Properties of Substrate Layer

In the substrate layer, the ratio of the tensile storage elastic modulus of the substrate layer at frequency of 950 Hz and temperature of 23° C., with respect to the tensile storage elastic modulus of the impact absorbing layer at frequency of 950 Hz and temperature of 23° C., is preferably, for example, 1.5 or more, more preferably 3 or more, and further preferably 5 or more. Also, the ratio of the tensile storage elastic modulus is preferably, for example, 70 or less. By the impact absorbing layer being softer than the substrate layer so as the ratio of the tensile storage elastic modulus is within the above range, the impact absorbing layer is deformed when an impact is applied to the front panel for a display device, whereby the impact may be absorbed and impact resistance may be enhanced. Also, be the substrate layer being harder than the impact absorbing layer so as the ratio of the tensile storage elastic modulus is within the above range, a substrate layer having a high hardness may be obtained.

The tensile storage elastic modulus of the substrate layer is not particularly limited as long as it satisfies the ratio of the tensile storage elastic modulus described above. For example, when the substrate layer is a resin substrate, as will be described later, the tensile storage elastic modulus of the resin substrate at frequency of 950 Hz and temperature of 23° C. may be 5000 MPa or more and 7500 MPa or less. Meanwhile, for example, when the substrate layer is a glass substrate, as will be described later, the tensile storage elastic modulus of the glass substrate is generally much higher than the resin substrate, and for example, the tensile storage elastic modulus of the glass substrate at frequency of 950 Hz and temperature of 23° C. is a degree of several ten thousands MPa.

Here, for the tensile storage elastic modulus of the substrate layer at frequency of 950 Hz and temperature of 23° C., the tensile storage elastic modulus at frequency of 950 Hz and temperature of 23° C. is measured for three times, and the arithmetic average value of the three measurements is obtained.

Also, the method for measuring tensile storage elastic modulus of the substrate layer may be the same as the method for measuring tensile storage elastic modulus of the impact absorbing layer described above.

(2) Material for Substrate Layer

The substrate layer is not particularly limited as long as it satisfies the tensile storage elastic modulus described above, and has transparency; and examples thereof may include a resin substrate, and a glass substrate.

(a) Resin Substrate

The resin constituting the resin substrate is not particularly limited as long as it satisfies the tensile storage elastic modulus described above, and is able to obtain a resin substrate having transparency; and examples thereof may include a polyimide based resin, a polyamide based resin, and a polyester based resin. Examples of the polyimide based resin may include polyimide, polyamideimide, polyetherimide, and polyesterimide. Examples of the polyester based resin may include polyethylene terephthalate, polypropylene terephthalate, polybutylene terephthalate, and polyethylene naphthalate. Among them, the polyimide based resin, the polyamide based resin, or a mixture thereof is preferable since it has bending resistance and has excellent hardness and transparency, and the polyimide based resin is more preferable.

The polyimide based resin is not particularly limited as long as it satisfies the tensile storage elastic modulus described above and has transparency; and among the above, polyimide and polyamideimide are preferably used.

(i) Polyimide

The polyimide is obtained by reacting a tetracarboxylic acid component and a diamine component. The polyimide is not particularly limited as long as it satisfies the tensile storage elastic modulus described above and has transparency; and it is preferable to have at least one kind of the structure selected from the group consisting of the structure represented by the following general formula (5) and the following general formula (7), for example, from the viewpoint of having excellent transparency and excellent rigidity.

[Chemical 5]

(5)

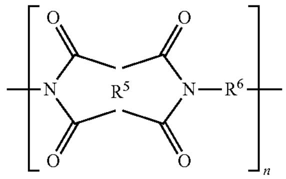

In the general formula (5), $R^5$ represents a tetravalent group which is a tetracarboxylic acid residue, $R^6$ represents at least one kind of divalent group selected from the group consisting of a trans-cyclohexanediamine residue, a trans-1,4-bismethylenecyclohexanediamine residue, a 4,4'-diaminodiphenylsulfone residue, a 3,4'-diaminodiphenylsulfone residue, and a divalent group represented by the following general formula (6). The "n" represents the number of repeating units, and is 1 or more.

[Chemical 6]

(6)

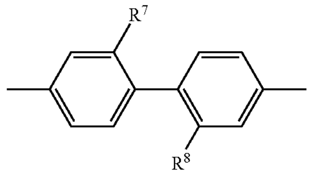

In the general formula (6), $R^7$ and $R^8$ each independently represent a hydrogen atom, an alkyl group, or a perfluoroalkyl group.

[Chemical 7]

(7)

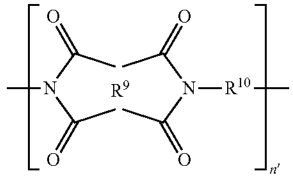

In the general formula (7), $R^9$ represents at least one kind of tetravalent group selected from the group consisting of a cyclohexane tetracarboxylic acid residue, a cyclopentanetetracarboxylic acid residue, a dicyclohexane-3,4,3', a 4'-tetracarboxylic acid residue, and a 4,4'-(hexafluoroisopropylidene)diphthalic acid residue; and $R^{10}$ represents a divalent group which is a diamine residue. The "n'" represents the number of repeating units, and is 1 or more.

Incidentally, "tetracarboxylic acid residue" refers to a residue obtained by excluding four carboxyl groups from a tetracarboxylic acid; and represents the same structure as a residue obtained by excluding an acid dianhydride structure from a tetracarboxylic acid dianhydride. Also, "diamine residue" refers to a residue obtained by excluding two amino groups from a diamine.

In the general formula (5), $R^5$ is a tetracarboxylic acid residue, and may be a residue obtained by excluding an acid dianhydride structure from a tetracarboxylic acid dianhydride. Examples of the tetracarboxylic acid dianhydride may include those described in WO 2018/070523. Among them, $R^5$ in the general formula (5) preferably includes at least one kind selected from the group consisting of a 4,4'-(hexafluoroisopropylidene)diphthalic acid residue, a 3,3',4,4'-biphenyltetracarboxylic acid residue, pyromellitic acid residue, a 2,3',3,4'-biphenyltetracarboxylic acid residue, a 3,3',4'-benzophenone tetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentane tetracarboxylic acid residue from the viewpoint of improved transparency and improved stiffness. It is further preferable to include at least one kind selected from the group consisting of a 4,4'-(hexafluoroisopropylidene) diphthalic acid residue, a 4,4'-oxydiphthalic acid residue and a 3,3',4,4'-diphenylsulfone tetracarboxylic acid residue.

In $R^5$, these preferable residues are preferably included in total of 50 mol % or more, more preferably 70 mol % or more, and further preferably 90 mol % or more.

Also, as $R^5$, it is also preferable to use a mixture of the followings: a group of tetracarboxylic acid residues (Group A) suitable for improving rigidity such as at least one kind selected from the group consisting of a 3,3',4,4'-biphenyltetracarboxylic acid residue, a 3,3',4,4'-benzophenone tetracarboxylic acid residue, and a pyromellitic acid residue; and a group of tetracarboxylic acid residues (Group B) suitable for improving transparency such as at least one kind selected from the group consisting of a 4,4'-(hexafluoroisopropylidene)diphthalic acid residue, a 2,3',3,4'-biphenyltetracarboxylic acid residue, a 3,3',4,4'-diphenylsulfone tetracarboxylic acid residue, a 4,4'-oxydiphthalic acid residue, a cyclohexane tetracarboxylic acid residue, and a cyclopentanetetracarboxylic acid residues.

In this case, in relation to the content ratio of the tetracarboxylic acid residue group suitable for improving the rigidity (Group A) and the tetracarboxylic acid residue group suitable for improving transparency (Group B), with respect to 1 mol of the tetracarboxylic acid residue group suitable for improving transparency (Group B), the tetracarboxylic acid residue group suitable for improving rigidity (Group A) is preferably 0.05 mol or more and 9 mol or less, more preferably 0.1 mol or more and 5 mol or less, and further preferably 0.3 mol or more and 4 mol or less.

Among them, $R^6$ in the general formula (5) is preferably at least one kind of divalent group selected from the group consisting of a 4,4'-diaminodiphenylsulfone residue, a 3,4'-diaminodiphenylsulfone residue, and a divalent group represented by the general formula (6); and is further preferably at least one kind of divalent group selected from the group consisting of a 4,4'-diaminodiphenylsulfone residue, a 3,4'-diaminodiphenylsulfone residue, and a divalent group represented by the general formula (6) wherein $R^7$ and $R^8$ are a perfluoroalkyl group, from the viewpoint of improved transparency and improved stiffness.

Among them, from the viewpoint of improved transparency and improved rigidity, $R^9$ in the general formula (7) preferably includes a 4,4'-(hexafluoroisopropylidene) diphthalic acid residue, a 3,3',4,4'-diphenylsulfontetracarboxylic acid residue, and oxydiphthalic acid residue.

The $R^9$ preferably includes 50 mol % or more, more preferably 70 mol % or more, and further preferably 90 mol % or more of these preferable residues.

The $R^{10}$ in the general formula (7) is a diamine residue, and may be a residue obtained by excluding two amino groups from a diamine. Examples of the diamine may include those described in WO 2018/070523. Among them, from the viewpoint of improved transparency and improved rigidity, $R^{10}$ in the general formula (7) preferably includes at least one kind of divalent group selected from the group consisting of a 2,2'-bis(trifluoromethyl)benzidine residue, a bis[4-(4-aminophenoxy)phenyl]sulfone residue, a 4,4'-diaminodiphenylsulfone residue, a 2,2-bis[4-(4-aminophenoxy)phenyl]hexafluoropropane residue, a bis[4-(3-aminophenoxy)phenyl]sulfone residue, a 4,4'-diamino-2,2'-bis(trifluoromethyl)diphenylether residue, a 1,4-bis[4-amino-2-(trifluoromethyl)phenoxy]benzene residue, a 2,2-bis[4-(4-amino-2-trifluoromethylphenoxy)phenyl] hexafluoropropane residue, a 4,4'-diamino-2-(trifluoromethyl)diphenyl ether residue, a 4,4'-diaminobenzanilide residue, a N,N'-bis(4-aminophenyl) terephthalamide residue and a 9,9-bis(4-aminophenyl) fluorene residue; and further preferably includes at least one kind of divalent group selected from the group consisting of a 2,2'-bis(trifluoromethyl)benzidine residue, a bis[4-(4-aminophenoxy)phenyl]sulfone residue, and a 4,4'-diaminodiphenylsulfone residue.

In $R^{10}$, these preferable residues are preferably included in total of 50 mol % or more, more preferably 70 mol % or more, and further preferably 90 mol % or more.

Also, as $R^{10}$, it is also preferable to use a mixture of the followings: a group of diamine residues (Group C) suitable for improving rigidity such as at least one kind selected from the group consisting of a bis[4-(4-aminophenoxy)phenyl] sulfone residue, a 4,4'-diaminobenzanilide residue, a N,N'-bis(4-aminophenyl)terephthalamide residue, a paraphenylenediamine residue, a metaphenylenediamine residue, and a 4,4'-diaminodiphenylmethane residue; and a group of diamine residues (Group D) suitable for improving transparency such as at least one kind selected from the group consisting of a 2,2'-bis(trifluoromethyl)benzidine residue, a 4,4'-diaminodiphenyl sulfone residue, a 2,2-bis[4-(4-aminophenoxy)phenyl] hexafluoropropane residue, a bis[4-(3-aminophenoxy)phenyl] sulfone residue, a 4,4'-diamino-2,2'-bis(trifluoromethyl)diphenylether residue, a 1,4-bis[4-amino-2-(tirfluoromethyle)phenoxy] benzene residue, a 2,2'-bis[4-(4-amino-2-trifluoromethylphenoxy)phenyl] hexafluoropropane residue, a 4,4'-diamino-2(trifluoromethyl)dipenylether residue, and a 9,9-bis(4-aminophenyl) fluorene residue.

In this case, in relation to the content ratio of the diamine residue group suitable for improving the rigidity (Group C) and the diamine residue group suitable for improving transparency (Group D), with respect to 1 mol of the diamine residue group suitable for improving transparency (Group D), the diamine residue group suitable for improving rigidity (Group C) is preferably 0.05 mol or more and 9 mol or less, more preferably 0.1 mol or more and 5 mol or less, and further preferably 0.3 mol or more and 4 mol or less.

In the structure represented by the general formula (5) and the general formula (7), "n" and "n'" each independently represents the number of repeating units, and is 1 or more. The number of repeating units "n" in the polyimide may be appropriately selected according to the structure, and is not particularly limited. The average number of repeating units may be, for example, 10 or more and 2000 or less, and is preferably 15 or more and 1000 or less.

Also, the polyimide may include a polyamide structure in a part thereof. Examples of the polyamide structure that may be included may include a polyamideimide structure including a tricarboxylic acid residue such as trimellitic acid anhydride; and a polyamide structure including a dicarboxylic acid residue such as terephthalic acid.

From the viewpoint of improved transparency and improved surface hardness, at least one of the tetravalent group which is a tetracarboxylic acid residue of $R^5$ and $R^9$, and the divalent group which is a diamine residue of $R^6$ and $R^{10}$ preferably includes the followings: an aromatic ring; and at least one selected from the group consisting of (i) a fluorine atom, (ii) an aliphatic ring, and (iii) a structure wherein aromatic rings are connected to each other by an alkylene group which may be substituted with a sulfonyl group or a fluorine. When the polyimide includes at least one kind selected from a tetracarboxylic acid residue including an aromatic ring, and a diamine residue including an aromatic ring, the molecular skeleton becomes rigid, the orientation property is increased, and the surface hardness is improved; however, the absorption wavelength of the rigid aromatic ring skeleton tends to be shifted to the longer wavelength side, and the transmittance of the visible light region tends to be decreased. Meanwhile, when the polyimide includes (i) a fluorine atom, the transparency is improved since it may make the electronic state in the polyimide skeleton to a state wherein a charge transfer is difficult. Also, when the polyimide includes (ii) an aliphatic ring, transparency is improved since the transfer of charge in the skeleton may be inhibited by breaking the conjugation of n electrons in the polyimide skeleton. Also, when the polyimide includes (iii) a structure wherein aromatic rings are connected to each other by an alkylene group which may be substituted with a sulfonyl group or a fluorine, transparency is improved since the transfer of charge in the skeleton may be inhibited by breaking the conjugation of $\pi$ electrons in the polyimide skeleton.

Among them, from the viewpoint of improved transparency and improved surface hardness, at least one of the tetravalent group which is a tetracarboxylic acid residue of $R^5$ and $R^9$, and the divalent group which is a diamine residue of $R^6$ and $R^{10}$ preferably includes an aromatic ring and a fluorine atom; and the divalent group which is a diamine residue of $R^6$ and $R^{10}$ preferably includes an aromatic ring and a fluorine atom.

Specific examples of such polyimide may include those having a specific structure described in WO 2018/070523.

The polyimide may be synthesized by a known method. Also, a commercially available polyimide may be used. Examples of the commercially available products of polyimide may include Neopulim (registered trademark) from Mitsubishi Gas Chemical Company, Inc.

The weight average molecular weight of the polyimide is, for example, preferably 3000 or more and 500,000 or less, more preferably 5000 or more and 300,000 or less, and further preferably 10,000 or more and 200,000 or less. When the weight average molecular weight is too low, sufficient strength may not be obtained, and when the weight average molecular weight is too high, the viscosity is increased and the solubility is decreased, so that a substrate layer having a smooth surface and uniform thickness may not be obtained in some cases.

Incidentally, the weight average molecular weight of the polyimide may be measured by gel permeation chromatography (GPC). Specifically, the polyimide is used to be a N-methylpyrrolidone (NMP) solution having a concentration of 0.1% by mass; a 30 mmol % LiBr-NMP solution with a water content of 500 ppm or less is used for a developing solvent; and measurement is carried out using a GPC device (HLC-8120, used column: GPC LF-804 from SHODEX) from Tosoh Corporation under conditions of a sample injecting amount of 50 μL, a solvent flow rate of 0.4 mL/min, and at 37° C. The weight average molecular weight is determined on the basis of a polystyrene standard sample having the same concentration as that of the sample.

(ii) Polyamideimide

The polyamideimide is not particularly limited as long as it satisfies the tensile storage elastic modulus described above, and has transparency; and examples thereof may include those having a first block including constituent unit derived from dianhydride, and constituent unit derived from diamine; and a second block including constituent unit derived from aromatic dicarbonyl compound, and constituent unit derived from aromatic diamine. In the polyamideimide described above, the dianhydride may include, for example, biphenyltetracarboxylic acid dianhydride (BPDA) and 2-bis(3,4-dicarboxyphenyl)hexafluoropropanedianhydride (6FDA). Also, the diamine may include bistrifluoromethylbenzidine (TFDB). That is, the polyamideimide has a structure wherein a polyamideimide precursor including a first block wherein monomers including dianhydride and diamine are copolymerized; and a second block wherein monomers including an aromatic dicarbonyl compound and an aromatic diamine are copolymerized, is imidized. By including the first block including an imide bond and the second block including an amide bond, the polyamideimide is excellent in not only optical properties but also thermal and mechanical properties. In particular, by using bistrifluoromethylbenzidine (TFDB) as the diamine forming the first block, thermal stability and optical properties may be improved. Also, by using 2-bis(3,4-dicarboxyphenyl) hexafluoropropane dianhydride (6FDA) and biphenyltetracarboxylic acid dianhydride (BPDA) as the dianhydride forming the first block, birefringence may be improved, and heat resistance may be secured.

The dianhydride forming the first block comprises two kinds of dianhydrides, that is, 6FDA and BPDA. In the first block, a polymer to which TFDB and 6FDA are bonded, and a polymer to which TFDB and BPDA are bonded may be included, based on separate repeating units, respectively segmented; may be regularly arranged within the same repeating unit; and may be included in a completely random arrangement.

Among the monomers forming the first block, BPDA and 6FDA is preferably included as dianhydrides in a molar ratio of 1:3 to 3:1. This is because it is possible not only to secure optical property, but also to suppress deterioration of mechanical property and heat resistance, and it is possible to have excellent birefringence.

The molar ratio of the first block and the second block is preferably 5:1 to 1:1. When the content of the second block is remarkably low, the effect of improving the thermal stability and mechanical property due to the second block may not be sufficiently obtained in some cases. Also, when the content of the second block is higher than the content of the first block, although the thermal stability and mechanical property may be improved, optical property such as yellowness and transmittance, may be deteriorated, and the birefringence property may also be increased in some cases. Incidentally, the first block and the second block may be random copolymers, and may be block copolymers. The repeating unit of the block is not particularly limited.

Examples of the aromatic dicarbonyl compound forming the second block may include one kind or more selected from the group consisting of terephthaloyl chloride (p-terephthaloyl chloride, TPC), terephthalic acid, iso-phthaloyl dichloride, and 4,4'-benzoyl dichloride (4,4'-benzoyl chloride). One kind or more selected from terephthaloyl chloride (p-terephthaloyl chloride, TPC) and iso-phthaloyl dichloride may be preferably used.

Examples of the diamine forming the second block may include diamines including one kind or more flexible group selected from the group consisting of 2,2-bis(4-(4-aminophenoxy)phenyl)hexafluoropropane (HFBAPP), bis(4-(4-aminophenoxy)phenyl)sulfone (BAPS), bis(4-(3-aminophenoxy)phenyl)sulfone (BAPSM), 4,4'-diaminodiphenyl sulfone (ODDS), 3,3'-diaminodiphenyl sulfone (3DDS), 2,2-bis(4-(4-aminophenoxy)phenylpropane (BAPP), 4,4'-diaminodiphenylpropane (6HDA), 1,3-bis(4-aminophenoxy) benzene (134APB), 1,3-bis(3-aminophenoxy)benzene (133APB), 1,4-bis(4-aminophenoxy)biphenyl (BAPB), 4,4'-bis(4-amino-2-trifluoromethylphenoxy)biphenyl (6FAPBP), 3,3-diamino-4,4-dihydroxydiphenylsulfone (DABS), 2,2-bis(3-amino-4-hydroxyloxyphenyl)propane (BAP), 4,4'-diaminodiphenylmethane (DDM), 4,4'-oxydianiline (4-CDA) and 3,3'-oxydianiline (3-CDA).

When the aromatic dicarbonyl compound is used, it is easy to realize high thermal stability and mechanical properties, but may exhibit high birefringence due to the benzene ring in the molecular structure. Therefore, in order to suppress the decrease in birefringence due to the second block, it is preferable to use a diamine wherein a flexible group is introduced into the molecular structure. Specifically, the diamine is more preferably one kind or more diamine selected from bis(4-(3-aminophenoxy)phenyl)sulfone (BAPSM), 4,4'-diaminodiphenylsulfone (ODDS) and 2,2-bis(4-(4-aminophenoxy)phenyl)hexafluoropropane (HF-BAPP). In particular, the longer the length of the flexible group such as BAPSM, and a diamine including a substituent at meta position, the better the birefringence may be exhibited.

For the polyamideimide precursor including a first block wherein a dianhydride including a biphenyltetracarboxylic acid dianhydride (BPDA) and a 2-bis(3,4-dicarboxyphenyl) hexafluoropropanedianhydride (6FDA), and a diamine including bistrifluoromethylbenzidine (TFDB) are copolymerized; and a second block wherein an aromatic dicarbonyl compound and an aromatic diamine are copolymerized, in the molecular structure, the weight average molecular weight measured by GPC is preferably, for example, 200,000 or more and 215,000 or less, and the viscosity is preferably, for example, 2400 poise or more and 2600 poise or less.

The polyamideimide may be obtained by imidizing a polyamideimide precursor. Also, a polyamideimide film may be obtained using the polyamideimide.

For a method for imidizing the polyamideimide precursor and a method for producing a polyamideimide film, JP-A No. 2018-506611, for example, may be referred.

(b) Glass Substrate

The glass constituting the glass substrate is not particularly limited as long as it satisfies the tensile storage elastic modulus described above, and has transparency; and examples thereof may include silicate glass and silica glass. Among them, borosilicate glass, aluminosilicate glass, and aluminoborosilicate glass are preferable, and alkali-free glass is more preferable. Examples of the commercial products of the glass substrate may include ultra-thin plate glass G-Leaf from Nippon Electric Glass Co., Ltd., and ultra-thin film glass from Matsunami Glass Ind., Ltd.

Also, the glass constituting the glass substrate is preferably a chemically strengthened glass. The chemically strengthened glass is preferable since it has excellent mechanical strength and may be made thin accordingly. The chemically strengthened glass is typically a glass wherein mechanical properties are strengthened by a chemical method by partially exchanging ionic species, such as by replacing sodium with potassium, in the vicinity of the surface of glass, and includes a compressive stress layer on the surface.

Examples of the glass constituting the chemically strengthened glass substrate may include aluminosilicate glass, soda-lime glass, borosilicate glass, lead glass, alkali barium glass, and aluminoborosilicate glass.

Examples of the commercial products of the chemically strengthened glass substrate may include Gorilla Glass from Corning Incorporated, and Dragontrail from AGC Inc.

Among them, as the substrate layer, a polyimide based resin substrate including a polyimide based resin or a glass substrate is preferable. This is because it may be a substrate layer having bending resistance and excellent hardness and transparency.

(3) Constitution of Substrate Layer

The thickness of the substrate layer is not particularly limited as long as it has a thickness capable of having flexibility, and is appropriately selected according to the type of the substrate layer.

The thickness of the resin substrate is preferably, for example, 10 μm or more and 100 μm or less, and more preferably 25 μm or more and 80 μm or less. When the thickness of resin substrate is within the above range, good flexibility may be obtained, and at the same time, satisfactory hardness may be obtained. It is also possible to suppress curling of the front panel for a display device. Furthermore, it is preferable in terms of reducing the weight of the front panel for a display device.

The thickness of the glass substrate is preferably, for example, 200 μm or less, more preferably 15 μm or more and 100 μm or less, further preferably 20 μm or more and 90 μm or less, and particularly preferably 25 μm or more and 80 μm or less. When the thickness of the glass substrate is within the above range, good flexibility may be obtained, and at the same time, satisfactory hardness may be obtained. It is also possible to suppress curling of the front panel for a display device. Furthermore, it is preferable in terms of reducing the weight of the front panel for a display device.

4. Other Configurations

In addition to the layers described above, the front panel for a display device in the present disclosure may include other layer, according to the needs. Examples of the other layer may include a hard coating layer, and a scattering prevention layer.

(1) Hard Coating Layer

Figure 2:
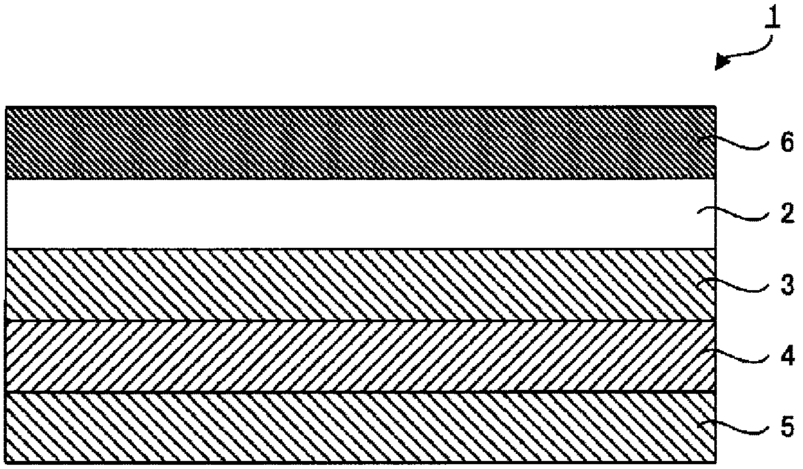
FIG. 2 is a schematic cross-sectional view illustrating an example of a front panel for a display device in the present disclosure.

When the substrate layer is a resin substrate, as illustrated in FIG. 2 for example, the front panel for a display device in the present disclosure may further include hard coating layer 6 of the substrate layer (resin substrate) 2, on the opposite surface side with respect to the A layer 3. The hard coating layer is a member to enhance the surface hardness. By placing the hard coating layer, scratch resistance may be improved.

The hard coating layer comprises a cured product of a resin composition including polymerizable compound. The cured product of a resin composition including polymerizable compound may be obtained by carrying out a polymerization reaction of a polymerizable compound, by a known method using a polymerization initiator according to the needs.

The polymerizable compound includes at least one polymerizable functional group in the molecule. As the polymerizable compound, for example, at least one kind of radical polymerizable compound and cation polymerizable compound may be used.

The radical polymerizable compound is a compound including a radical polymerizable group. The radical polymerizable group included in the radical polymerizable compound may be any functional group capable of generating a radical polymerization reaction, and is not particularly limited; and examples thereof may include a group including a carbon-carbon unsaturated double bond, and specific examples thereof may include a vinyl group and a (meth) acryloyl group. Incidentally, when the radical polymerizable compound includes two or more radical polymerizable groups, these radical polymerizable groups may be the same or different from each other.

The number of radical polymerizable group included in one molecule of the radical polymerizable compound is preferably two or more, and more preferably three or more, from the viewpoint of improving the hardness of the hard coating layer.

In the present specification, (meth) acryloyl represents each of acryloyl and methacryloyl.

The cation polymerizable compound is a compound including a cation polymerizable group. The cation polymerizable group included in the cation polymerizable compound may be a functional group capable of generating a cation polymerization reaction, and is not particularly limited; and examples thereof may include, for example, an epoxy group, an oxetanyl group, and a vinyl ether group. Incidentally, when the cation polymerizable compound includes two or more cation polymerizable groups, these cation polymerizable groups may be the same or different from each other.

The number of the cation polymerizable group included in one molecule of the cation polymerizable compound is preferably two or more, and more preferably three or more, from the viewpoint of improving the hardness of the hard coating layer.

The resin composition may include a polymerization initiator if necessary. The polymerization initiator may be appropriately selected from, for example, a radical polymerization initiator, a cation polymerization initiator, and a radical and cation polymerization initiator. These polymerization initiators are decomposed by at least one kind of light irradiation and heating to generate radicals or cations to cause radical polymerization and cation polymerization to proceed. Incidentally, all of the polymerization initiator is decomposed and not left in the hard coating layer, in some cases.

The hard coating layer may further include an additive, if necessary. The additive is appropriately selected according to the function to be imparted to the hard coating layer, and is not particularly limited; and examples thereof may include a filler, an ultraviolet absorber, an infrared absorber, an antifouling agent, an antiglare agent, an antistatic agent, a leveling agent, a surfactant, an easy lubricant, various sensitizers, a flame retardant, an adhesive imparting agent, a polymerization inhibitor, an antioxidant, a light stabilizer, and a surface modifier.

The thickness of the hard coating layer may be appropriately selected according to the function of the hard coating layer and the use application of the front panel for a display device. The thickness of the hard coating layer is preferably, for example, 2 μm or more and 50 μm or less, more preferably 3 μm or more and 30 μm or less, further preferably 5 μm or more and 20 μm or less, and particularly preferably 6 μm or more and 10 μm or less. When the thickness of hard coating layer is within the above range, sufficient hardness as the hard coating layer may be obtained.

Examples of a method for forming a hard coating layer may include a method wherein the substrate layer is coated with a curable resin composition for a hard coating layer including the polymerizable compound, and cured.

(2) Scattering Prevention Layer

Figure 3:
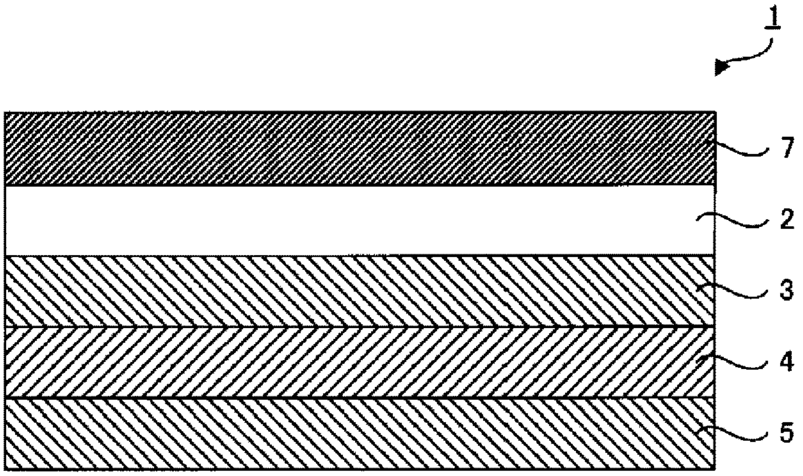
FIG. 3 is a schematic cross-sectional view illustrating an example of a front panel for a display device in the present disclosure.

When the substrate layer is a glass substrate, as illustrated in FIG. 3 for example, the front panel for a display device in the present disclosure may include scattering prevention layer 7 on the substrate layer 2, on the opposite surface side with respect to the A layer 3. By placing the scattering prevention layer, the scattering of the glass when the glass is broken may be suppressed.

The material used for the scattering prevention layer is not particularly limited as long as it is capable of obtaining a scattering prevention effect of glass and has transparency; and examples thereof may include polyimide based resin, polyamide based resin, polyester based resin, and acryl based resin. Examples of the polyimide based resin may include polyimide, polyamideimide, polyetherimide, and polyesterimide. Examples of the polyester based resin may include polyethylene terephthalate, polypropylene terephthalate, polybutylene terephthalate, and polyethylene naphthalate.

The scattering prevention layer may further include an additive, according to the needs. The additive is appropriately selected according to the function imparted to the scattering prevention layer, and is not particularly limited. Examples thereof may include a filler.

The thickness of the scattering prevention layer may be appropriately selected according to the function of the scattering prevention layer and the use application of the front panel for a display device. The thickness of the scattering prevention layer is preferably, for example, 5 μm or more and 150 μm or less, and more preferably 10 μm or more and 100 μm or less. When the thickness of scattering prevention layer is within the above range, sufficient scattering preventing effect and transparency may be obtained.

As the scattering prevention layer, for example, a film shaped scattering prevention layer may be used, and the scattering prevention layer may be placed on the substrate layer via a pressure-sensitive adhesive layer or an adhesive layer. Also, for example, a composition for a scattering prevention layer may be used, and a composition for a scattering prevention layer may be applied onto the substrate layer and cured to form a scattering prevention layer.

5. Properties of Front Panel for Display Device

The total light transmittance of the front panel for a display device in the present disclosure is preferably, for example, 85% or more, more preferably 88% or more, and further preferably 90% or more. By having such high total light transmittance, a front panel for a display device having good transparency may be obtained.

Here, the total light transmittance of the front panel for a display device may be measured according to JIS K7361-1, for example, with a haze meter HM150 from Murakami Color Research Laboratory Co., Ltd.

The haze of the front panel for a display device in the present disclosure is preferably, for example, 5% or less, more preferably 2% or less, and further preferably 1% or less. By having such low haze, a front panel for a display device having good transparency may be obtained.

Here, the haze of the front panel for a display device may be measured according to JIS K-7136, for example, with a haze meter HM150 from Murakami Color Research Laboratory Co., Ltd.

6. Use Application of Front Panel for Display Device

In a display device, the front panel for a display device in the present disclosure may be used as a member placed on the observer side than the display panel. The front panel for a display device in the present disclosure may be used for a front panel in a display device such as, for example, a smart phone, a tablet terminal, a wearable terminal, a personal computer, a television, a digital signage, a public information display (PID), and an in-vehicle display. Among them, the front panel for a display device in the present disclosure may be suitably used for a front panel in a flexible display such as a foldable display, a rollable display, and a bendable display.

A display device using the front panel for a display device in the present disclosure may be provided with a display panel, and a front panel for a display device placed on an observer side of the display panel.

Figure 4:
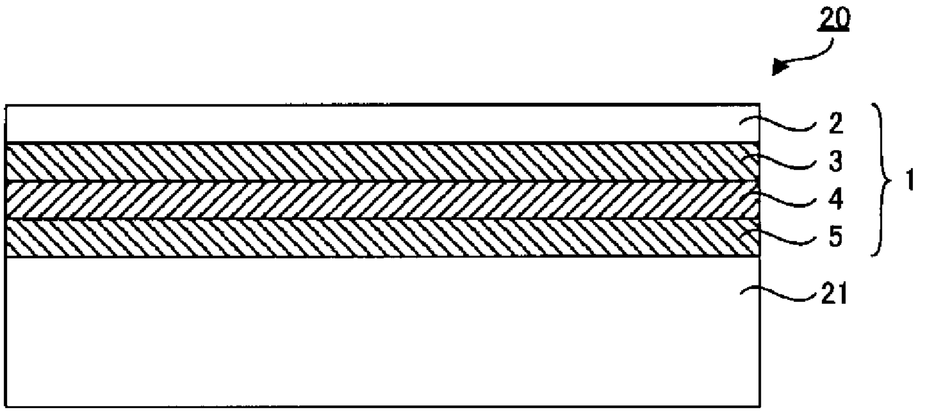
FIG. 4 is a schematic cross-sectional view illustrating an example of a display device in the present disclosure.

FIG. 4 is a schematic cross-sectional view illustrating an example of a display device in the present disclosure. As illustrated in FIG. 4, display device 20 is provided with display panel 21, and front panel for a display device 1 placed on an observer side of the display panel 21.

When the front panel for a display device in the present disclosure is placed on the surface of the display device, it is preferable to place so that the substrate layer is on the outer side, and the B layer is on the display panel side.

A method for placing the front panel for a display device in the present disclosure on the surface of the display device is not particularly limited; and examples thereof may include a method wherein the B layer (pressure-sensitive adhesive layer) is interposed, when the B layer described above is a pressure-sensitive adhesive layer.

Examples of the display panel in the present disclosure may include a display panel used for a display device such as an organic EL display device, and a liquid crystal display device.

The display device in the present disclosure may include a touch panel member between the display panel and the front panel for a display device.

The display device in the present disclosure is preferably a flexible display. Since the display device in the present disclosure includes the front panel for a display device described above, it is preferable as a flexible display.

B. Flexible Organic Electroluminescence Display Device

The flexible organic electroluminescence display device in the present disclosure comprises an organic electroluminescence display panel, and the front panel for a display device described above placed on an observer side of the organic electroluminescence display panel. Incidentally, hereinafter, electroluminescence may be abbreviated as EL.

Figure 5:
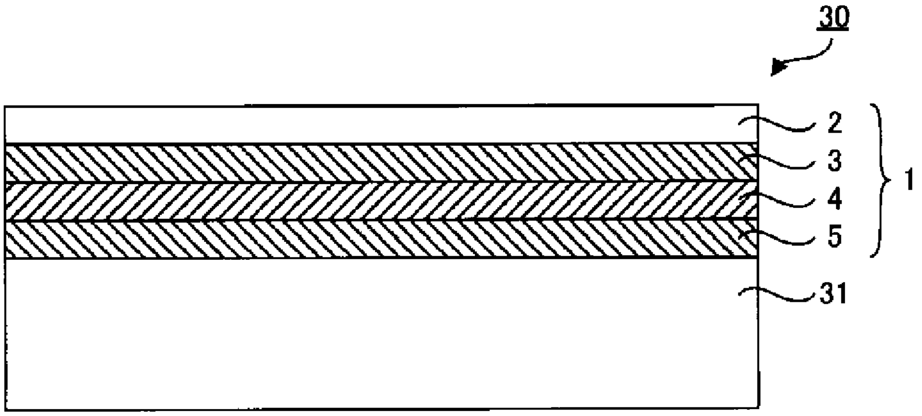
FIG. 5 is a schematic cross-sectional view illustrating an example of a flexible organic electroluminescence display device in the present disclosure.

FIG. 5 is a schematic cross-sectional view illustrating an example of a flexible organic EL display device in the present disclosure. As illustrated in FIG. 5, flexible organic EL display device 30 comprises organic EL display panel 31, and the front panel for a display device 1 placed on an observer side of the organic EL display panel 31. In the flexible organic EL display device 30, when the B layer 5 in the front panel for a display device 1 is a pressure-sensitive adhesive layer for example, the front panel for a display device 1 and the organic EL display panel 31 may be adhered via the B layer 5 (pressure-sensitive adhesive layer) of the front panel for a display device 1.

The front panel for a display device in the present disclosure may be similar to the front panel for a display device described above.

The organic EL display panel in the present disclosure may be similar to the configuration of a general organic EL display device.

The flexible organic EL display device in the present disclosure may include a touch panel member between the organic EL display panel and the front panel for a display device.

C. Stacked Body for a Display Device

The stacked body for a display device in the present disclosure is a stacked body for a display device used for a front panel for a display device, comprising an A layer, an impact absorbing layer, and a B layer, in this order, wherein a shear storage elastic modulus of the A layer and the B layer, at frequency of 950 Hz and temperature of 23° C., is 20 MPa or less, and in the impact absorbing layer, a tensile storage elastic modulus at frequency of 950 Hz and temperature of 23° C. is 200 MPa or more and 5000 MPa or less, and a glass transition temperature is 50° C. or more.

Figure 6:
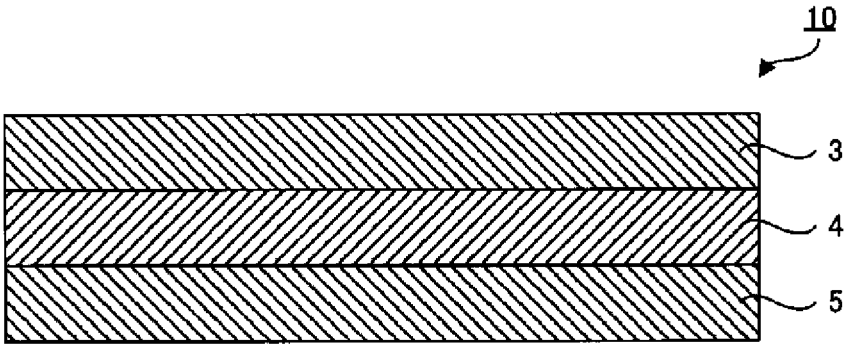
FIG. 6 is a schematic cross-sectional view illustrating an example of a stacked body for a display device in the present disclosure.

FIG. 6 is a schematic cross-sectional view illustrating an example of a stacked body for a display device in the present disclosure. As illustrated in FIG. 6, stacked body for a display device 10 comprises A layer 3, impact absorbing layer 4, and B layer 5, in this order. The A layer 3 and the B layer 5 have a predetermined shear storage elastic modulus, and in the impact absorbing layer 4 has a predetermined tensile storage elastic modulus and glass transition temperature.

In the stacked body for a display device in the present disclosure, as described in the section "A. Front panel for a display device" above, by placing the impact absorbing layer between the A layer and the B layer, those are softer than the impact absorbing layer, impact resistance may be improved.

Also in the present disclosure, by the glass transition temperature of the impact absorbing layer being a predetermined value or more, the condition of the material included in the impact absorbing layer is not changed immediately in the environmental temperature so that excellent impact resistance and flexibility may be maintained regardless of the environment temperature.

Further, when the stacked body for a display device in the present disclosure is used for a rollable display, shear stress generated when the display is winded, may be relieved by using the stacked body for a display device so that various problems during winding may be reduced.

Since the impact absorbing layer, the A layer, and the B layer constituting the stacked body for a display device in the present disclosure are described in detail in the section "A. Front panel for a display device" above, the explanation thereof is omitted here.

The total light transmittance of the stacked body for a display device in the present disclosure is preferably, for example, 85% or more, more preferably 88% or more, and further preferably 90% or more. By having such high total light transmittance, a stacked body for a display device having good transparency may be obtained.

The haze of the stacked body for a display device in the present disclosure is preferably, for example, 5% or less, more preferably 2% or less, and further preferably 1% or less. By having such low haze, a stacked body for a display device having good transparency may be obtained.

Here methods for measuring the total light transmittance and the haze of the stacked body for a display device may be similar to the methods for measuring the total light transmittance and the haze of the front panel for a display device described above.

The stacked body for a display in the present disclosure is used in the front panel for a display device described above, and may be used as a member to be stacked on a substrate layer in a front panel for a display device. The stacked body for a display device in the present disclosure may be used, for example, for a front panel in a display device such as a smart phone, a tablet terminal, a wearable terminal, a personal computer, a television, a digital signage, a public information display (PID), and an in-vehicle display. Among them, the stacked body for a display device in the present disclosure may be suitably used for a front panel in a flexible display such as a foldable display, a rollable display, and a bendable display.

D. Stacked Body

The stacked body in the present disclosure comprises an A layer, an impact absorbing layer, and a B layer, in this order, wherein a shear storage elastic modulus of the A layer and the B layer, at frequency of 950 Hz and temperature of 23° C., is 20 MPa or less, the impact absorbing layer includes a urethane based resin, and in the impact absorbing layer, a tensile storage elastic modulus at frequency of 950 Hz and temperature of 23° C. is 200 MPa or more and 5000 MPa or less, and a glass transition temperature is 50° C. or more.

Figure 7:
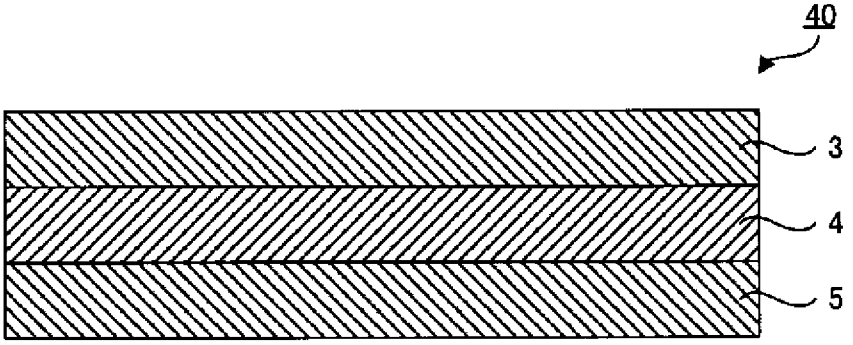
FIG. 7 is a schematic cross-sectional view illustrating an example of a stacked body in the present disclosure.

FIG. 7 is a schematic cross-sectional view illustrating an example of a stacked body in the present disclosure. As illustrated in FIG. 7, stacked body 40 comprises A layer 3, impact absorbing layer 4, and B layer 5, in this order. The A layer 3 and the B layer 5 have a predetermined shear storage elastic modulus, and the impact absorbing layer 4 includes a urethane based resin, and has a predetermined tensile storage elastic modulus and glass transition temperature.

In the stacked body in the present disclosure, as described in the section "A. Front panel for a display device" above, by placing the impact absorbing layer between the A layer and the B layer, those are softer than the impact absorbing layer, impact resistance may be improved.

Also in the present disclosure, by the glass transition temperature of the impact absorbing layer being a predetermined value or more, the condition of the material included in the impact absorbing layer is not changed immediately in the environmental temperature so that excellent impact resistance and flexibility may be maintained regardless of the environment temperature.

Since the impact absorbing layer, the A layer, and the B layer constituting the stacked body in the present disclosure are described in detail in the section "A. Front panel for a display device" above, the explanation thereof is omitted here.

The total light transmittance of the stacked body in the present disclosure is preferably, for example, 85% or more, more preferably 88% or more, and further preferably 90% or more. By having such high total light transmittance, a stacked body having good transparency may be obtained.

The haze of the stacked body in the present disclosure is preferably, for example, 5% or less, more preferably 2% or less, and further preferably 1% or less. By having such low haze, a stacked body having good transparency may be obtained.

Here methods for measuring the total light transmittance and the haze of the stacked body may be similar to the methods for measuring the total light transmittance and the haze of the front panel for a display device described above.

The stacked body in the present disclosure may be used as, for example, a member for a display device. The stacked body in the present disclosure may be used for, for example, a display device such as a smart phone, a tablet terminal, a wearable terminal, a personal computer, a television, a digital signage, a public information display (PID), and an in-vehicle display. Among them, the stacked body in the present disclosure may be suitably used for a flexible display such as a foldable display, a rollable display, and a bendable display.

Incidentally, the present disclosure is not limited to the embodiments. The embodiments are exemplification, and any other variations are intended to be included in the technical scope of the present disclosure if they have substantially the same constitution as the technical idea described in the claim of the present disclosure and offer similar operation and effect thereto.

EXAMPLES

The present disclosure is hereinafter explained in further details with reference to Examples and Comparative Examples.

Example 1

(Preparation of Substrate Layer and Formation of Hard Coating Layer)

As a substrate layer, a polyimide substrate having a thickness of 80 μm was prepared. One surface of the polyimide substrate was coated with a composition for a hard coating layer 1 described below, with a bar coater to form a coating film. Thereafter, the coating film was heated at 70° C. for 1 minute to evaporate the solvent in the coating film, and the coating film was cured by irradiating ultraviolet rays with a UV irradiation device (light source H bulb from Fusion UV System Japan K.K) under the condition of an oxygen concentration of 200 ppm or less so that the integrated light amount was 200 mJ/cm$^2$. Thus, a hard coating layer having a thickness of 5 μm was formed on the polyimide substrate.

<Composition for Hard Coating Layer 1>

- Mixture of dipentaerythritol pentaacrylate and dipentaerythritol hexaacrylate (product name "M403", from Toagosei Co., Ltd.): 25 parts by mass
- Dipentaerythritol EO-modified hexaacrylate (product name "A-DPH-6E", from Shin-Nakamura Chemical Co., Ltd.): 25 parts by mass
- Deformed silica particles (average particle size of 25 nm, from JGC Catalysts and Chemicals Ltd.) 50 parts by mass (value in terms of 100% solid content)
- Photopolymerization initiator (1-hydroxycyclohexylphenyl ketone, product name "Omnirad184", from IGM Resins B. V.): 4 parts by mass
- Fluorine based leveling agent (product name "F568" from DIC Corporation): 0.2 parts by mass (value in terms of 100% solid content)
- Methyl isobutyl ketone: 150 parts by mass (Production of Impact Absorbing Layer 1)

The polyethylene terephthalate material was melted at 290° C., extruded into a sheet through a film forming die, and cooled by closely contacting on a water-cooled rotating quench drum to produce an unstretched film. This unstretched film was preheated at 120° C. for 1 minute in a biaxial stretching test apparatus (from Toyo Seiki Co., LTD.) and then stretched at 120° C. to a stretching magnification of 4.5 times, and stretched at a stretching magnification of 1.5 times in a direction 90° from the stretching direction, to obtain impact absorbing layer 1 having a thickness of 80 μm.

(Production of Front Panel)

On the surface of the polyimide substrate opposite to the hard coating layer, the impact absorbing layer 1 was adhered via A layer (an acryl based pressure-sensitive adhesive film having a thickness of 50 μm, 8146-2 from 3M Co., Ltd.). Then, a front panel was produced by adhering B layer (an acryl based pressure-sensitive adhesive film having a thickness of 50 μm, 8146-2 from 3M Co., Ltd.) on the surface of impact absorbing layer 1 opposite to the A layer. Incidentally, separators placed on both sides of the acryl based pressure-sensitive adhesive film were peeled off before using as the A layer and the B layer.

Example 2

A front panel was produced in the same manner as in Example 1 except that the following impact absorbing layer 2 was used instead of the impact absorbing layer 1 in Example 1.

(Production of Impact Absorbing Layer 2)

As a releasing film, a polyethylene terephthalate substrate (product name "Cosmoshine (tradename) A4100" from Toyobo Co., Ltd) having a thickness of 50 μm was prepared. The untreated surface side of the polyethylene terephthalate substrate was coated with the following composition for an impact absorbing layer 1, with a bar coater so as the thickness after curing was 80 μm, to form a coating film. Thereafter, the coating film was heated at 70° C. for 1 minute to evaporate the solvent in the coating film, and the coating film was cured in air by irradiating ultraviolet rays with a UV irradiation device (light source H bulb from Fusion UV System Japan K.K) so that the integrated light amount was 500 $mJ/cm^2$, and impact absorbing layer 2 was obtained by peeling the cured coating film off from the polyethylene terephthalate substrate.

<Composition for Impact Absorbing Layer 1>

- Urethane acrylate (product name "UV-3310B" from Mitsubishi Chemical Corporation): 40 parts by mass
- Ethoxylated pentaerythritol tetraacrylate (product name "ATM-35E, from Shin-Nakamura Chemical Co., Ltd.): 5 parts by mass
- Phenoxyethyl acrylate (product name "Viscoat #192", from Osaka Organic Chemical Industry Ltd.): 5 parts by mass
- Mixture of pentaerythritol triacrylate and pentaerythritol tetraacrylate (product name "KAYARAD PET-30" from Nippon Kayaku Co., Ltd.): 50 parts by mass
- Polymerization initiator (1-hydroxycyclohexylphenyl ketone, product name "Omnirad184", from IGM Resins B. V.): 5 parts by mass
- Methyl isobutyl ketone: 10 parts by mass Example 3

A front panel was produced in the same manner as in Example 2 except that the thickness of the polyimide substrate was 50 μm in Example 2.

Example 4

A front panel was produced in the same manner as in Example 2 except that an acryl based pressure-sensitive adhesive film MHM-FWV50 from Nichieikako Co., Ltd. having thickness of 50 μm was used as the A layer and the B layer in Example 2.

Example 5

A front panel was produced in the same manner as in Example 1 except that the following impact absorbing layer 3 was used instead of the impact absorbing layer 2 in Example 2.

(Production of Impact Absorbing Layer 3)

Impact absorbing layer 3 was produced in the same manner as the impact absorbing layer 2 in Example 2 except that the following composition for an impact absorbing layer 2 was used.

<Composition for Impact Absorbing Layer 2>

- Urethane acrylate (product name "UV-3310B" from Mitsubishi Chemical Corporation): 15 parts by mass
- Ethoxylated pentaerythritol tetraacrylate (product name "ATM-35E, from Shin-Nakamura Chemical Co., Ltd.): 30 parts by mass
- Dicyclopentanylacrylate (product name "FA-513AS", from Showa Denko Materials Co., Ltd. (former Hitachi Chemical): 5 parts by mass
- Dipentaerythritol hexaacrylate (product name "KAYARAD DPHA" from Nippon Kayaku Co., Ltd.): 50 parts by mass
- Polymerization initiator (1-hydroxycyclohexylphenyl ketone, product name "Omnirad184", from IGM Resins B. V.): 5 parts by mass
- Methyl isobutyl ketone: 10 parts by mass Comparative Example 1

A front panel was produced in the same manner as in Example 1 except that the impact absorbing layer and the A layer were not provided in Example 1.

Comparative Example 2

A front panel was produced in the same manner as in Example 1 except that the polyimide substrate having a thickness of 80 μm used as a substrate layer in Example 1 was used as the impact absorbing layer, instead of the impact absorbing layer 1 in Example 1.

Comparative Example 3

A front panel was produced in the same manner as in Example 1 except that a urethane based resin film (DUS270-CER from Sheedom Co., Ltd.) having a thickness of 100 μm was used as the impact absorbing layer, instead of impact absorbing layer 1 in Example 1.

Comparative Example 4

(Preparation of Substrate Layer and Formation of Hard Coating Layer)

As in Example 1, a polyimide substrate having a thickness of 80 μm was used for the substrate layer, and a hard coating layer having a thickness of 5 μm was formed on this polyimide substrate.

(Formation of Impact Absorbing Layer)

Next, the surface of the polyimide substrate, opposite to the hard coating layer was coated with the composition for an impact absorbing layer 1 used in Example 2, with a bar coater so as the thickness after curing was 80 μm, to form a coating film. Thereafter, the coating film was heated at 70° C. for 1 minute to evaporate the solvent in the coating film, and the coating film was cured in air by irradiating ultraviolet rays with a UV irradiation device (light source H bulb from Fusion UV System Japan K.K) so that the integrated light amount was 500 mJ/cm$^2$, and an impact absorbing layer was formed directly on the polyimide substrate.

(Production of Front Panel)

Next, a front panel was produced by adhering B layer (an acryl based pressure-sensitive adhesive film having a thickness of 50 μm, 8146-2 from 3M Co., Ltd.) on the surface of impact absorbing layer, opposite to the polyimide substrate. Incidentally, separators placed on both sides of the acryl based pressure-sensitive adhesive film were peeled off before using as the B layer.

Comparative Example 5

A front panel was produced in the same manner as in Example 1 except that a urethane based resin film (DUS312-CD from Sheedom Co., Ltd.) having a thickness of 100 μm was used as the impact absorbing layer, instead of the impact absorbing layer 1 in Example 1.

Comparative Example 6

(Preparation of Substrate Layer and Formation of Hard Coating Layer)

As in Example 1, a polyimide substrate having a thickness of 80 μm was used for the substrate layer, and a hard coating layer having a thickness of 5 μm was formed on this polyimide substrate.

(Formation of A Layer)

The surface of the polyimide substrate, opposite to the hard coating layer, was coated with the composition for an impact absorbing layer 1 used in Example 2, with a bar coater so as the thickness after curing was 30 μm, to form a coating film. Thereafter, the coating film was heated at 70° C. for 1 minute to evaporate the solvent in the coating film, and the coating film was cured in air by irradiating ultraviolet rays with a UV irradiation device (light source H bulb from Fusion UV System Japan K.K) so that the integrated light amount was 500 mJ/cm$^2$, and as the A layer, a urethane based resin layer was formed on the polyimide substrate.

(Formation of Impact Absorbing Layer)

Then, the surface of the A layer, opposite to the polyimide substrate, was coated with the composition for an impact absorbing layer 1 used in Example 2, with a bar coater so as the thickness after curing was 70 μm, to form a coating film. Thereafter, the coating film was heated at 70° C. for 1 minute to evaporate the solvent in the coating film, and the coating film was cured in air by irradiating ultraviolet rays with a UV irradiation device (light source H bulb from Fusion UV System Japan K.K) so that the integrated light amount was 500 mJ/cm$^2$, and an impact absorbing layer was formed on the A layer.

(Production of Front Panel)

Next, a front panel was produced by adhering B layer (an acryl based pressure-sensitive adhesive film having a thickness of 50 μm, 8146-2 from 3M Co., Ltd.) on the surface of the impact absorbing layer, opposite to the A layer. Incidentally, separators placed on both sides of the acryl based pressure-sensitive adhesive film were peeled off before using as the B layer.

Example 6

(Formation of Hard Coating Layer)

One surface of a polyethylene terephthalate substrate (product name "Cosmoshine (tradename) A4300" from Toyobo Co., Ltd) having a thickness of 50 μm was coated with a composition for a hard coating layer 1 used in Example 1, with a bar coater to form a coating film. Thereafter, the coating film was heated at 70° C. for 1 minute to evaporate the solvent in the coating film, and the coating film was cured by irradiating ultraviolet rays with a UV irradiation device (light source H bulb from Fusion UV System Japan K.K) under the condition of an oxygen concentration of 200 ppm or less so that the integrated light amount was 200 mJ/cm$^2$. Thus, a hard coating layer having a thickness of 5 μm was formed on the polyethylene terephthalate substrate.

(Production of Front Panel)

A chemically strengthened glass substrate having a thickness of 70 μm was prepared, and the glass substrate and the surface of the polyethylene terephthalate substrate, opposite to the hard coating layer, were adhered via a pressure-sensitive adhesive layer (a pressure-sensitive adhesive film having a thickness of 25 μm, 8146-1 from 3M Co., Ltd.). Then, on the surface of the glass substrate, opposite to the pressure-sensitive adhesive film, the impact absorbing layer 1 used in Example 1 was adhered via A layer (an acryl based pressure-sensitive adhesive film having a thickness of 50 μm, 8146-2 from 3M Co., Ltd.). Further, a front panel was produced by adhering B layer (an acryl based pressure-sensitive adhesive film having a thickness of 50 μm, 8146-2 from 3M Co., Ltd.) on the surface of impact absorbing layer 1, opposite to the A layer. Incidentally, separators placed on both sides of the pressure-sensitive adhesive film were peeled off before using as the pressure-sensitive adhesive layer, the A layer and the B layer.

Example 7

A front panel was produced in the same manner as in Example 6 except that the impact absorbing layer 2 used in Example 2 was used instead of the impact absorbing layer 1 in Example 6.

Comparative Example 7

A front panel was produced in the same manner as in Example 6 except that the impact absorbing layer and the A layer were not provided in Example 6.

Comparative Example 8

A front panel was produced in the same manner as in Example 6 except that a urethane based resin film (DUS270-CER from Sheedom Co., Ltd.) having a thickness of 100 μm was used as the impact absorbing layer, in Example 6.

Example 8

A front panel was produced in the same manner as in Example 1 except that a silicone based pressure-sensitive adhesive film MHM-SI50 from Nichieikako Co., Ltd. having thickness of 50 μm was used as the A layer and the B layer, in Example 1.

Example 9

A front panel was produced in the same manner as in Example 2 except that a silicone based pressure-sensitive adhesive film MHM-SI50 from Nichieikako Co., Ltd. having thickness of 50 μm was used as the A layer and the B layer, in Example 2.

Example 10

A front panel was produced in the same manner as in Example 5 except that a silicone based pressure-sensitive adhesive film MHM-SI50 from Nichieikako Co., Ltd. having thickness of 50 μm was used as the A layer and the B layer, in Example 5.

[Evaluation]

(1) Tensile Storage Elastic Modulus

For the impact absorbing layer and the polyimide substrate constituting the front panel in Examples and Comparative Examples, the tensile storage elastic modulus at frequency of 950 Hz and temperature of 23° C. was measured with a dynamic mechanical analyzing device (DMA). Firstly, the impact absorbing layer and the polyimide substrate were respectively punched into a rectangular shape of 40 mm×5 mm to obtain a measurement sample. Then, this measurement sample was installed into a tensile measuring jig of the dynamic mechanical analyzing device. Specifically, the measuring jig was provided with a chuck jig that sandwiches a film, at the top and bottom respectively, one end of the rectangular measurement sample was fixed by the upper chuck, the other end was fixed by the lower chuck, so as the pulling direction was the longitudinal direction of the measurement sample. At this time, the distance between the chucks was 20 mm, and the measurement sample was adjusted and fixed so as not to slack and not to be excessively pulled. Thereafter, a tensile load (static load) was applied in an environment at temperature of 23° C., and longitudinal vibrations at frequency of 950 Hz are applied by a tensile method (sine wave distortion, tensile modes, strain amounts: auto-distortion) to measure the tensile storage elastic modulus. Further, the measurement described above was repeated for three times, the arithmetic average value of three times was regarded as the tensile storage elastic modulus at frequency of 950 Hz and temperature of 23° C. As the dynamic mechanical analyzing device, a Rheogel-E4000 from UBM Corporation was used. The measurement conditions were as follows. The results are shown in Table 1.

(Measurement Conditions of Tensile Storage Elastic Modulus)

- Measurement sample: 40 mm×5 mm rectangle
- Measuring jig: pull
- Distance between chucks (measurement sample length between chucks): 20 mm
- Distortion waveform: sine wave
- Distortion control: automatic adjustment
- Frequency: 950 Hz
- Temperature: 23° C.
- Static load control: 50 g (constant static load); however, when the distance between chucks is extended by 2 mm or more at the time of load application, the load was reduced to 10 g (constant static load) or 5 g (constant static load).

(2) Shear Storage Elastic Modulus

For the A layer and the B layer constituting the front panel in Examples and Comparative Examples, the shear storage elastic modulus at frequency of 950 Hz and temperature of 23° C. was measured with a dynamic mechanical analyzing device (DMA). Firstly, each of the A layer and the B layer was punched into a rectangular shape of 10 mm×5 mm to obtain a measurement sample. Then, two pieces of this measurement sample were prepared and installed into a solid shear jig of the dynamic mechanical analyzing device. Specifically, in the solid shear jig, three plates were provided in the vertical direction, that is, one metal inner plate having a thickness of 1 mm, and two L-shaped metal outer plates placed on both sides of the inner plate are provided; one of the measurement samples was sandwiched between the inner plate and one outer plate, and the other measurement sample was sandwiched between the inner plate and the other outer plate. Then, the solid shear jig was installed into a dynamic mechanical analyzing device at distance between chucks of 20 mm, and the shear storage elastic modulus was measured in an environment at temperature of 23° C., applying longitudinal vibrations with a strain amount of 1% and frequency of 950 Hz to the two outer plates while fixing the inner plate. Further, the measurement described above was repeated for three times, the arithmetic average value of three times was regarded as the shear storage elastic modulus at frequency of 950 Hz and temperature of 23° C. As the dynamic mechanical analyzing device, a Rheogel-E4000 from UBM Corporation was used. The measurement conditions were as follows. The results are shown in Table 1.

(Measurement Conditions of Shear Storage Elastic Modulus)

- Measurement sample: 10 mm×5 mm rectangle (two samples)
- Measuring jig: solid shear
- Distortion waveform: sine wave
- Distortion control: automatic adjustment
- Frequency: 950 Hz
- Temperature: 23° C.

(3) Glass Transition Temperature a) Impact Absorbing Layer

For the impact absorbing layer constituting the front panel in Examples and Comparative Examples, the glass transition temperature was measured by a method based on the peak-top value of the tensile loss tangent (tan δ) (DMA method). Firstly, the impact absorbing layer was punched into a rectangular shape of 40 mm×5 mm to obtain a measurement sample. Then, this measurement sample was installed into a tensile measuring jig of the dynamic mechanical analyzing device. Specifically, the measuring jig was provided with a chuck jig that sandwiches a film, at the top and bottom respectively, one end of the rectangular measurement sample was fixed by the upper chuck, the other end was fixed by the lower chuck, so as the pulling direction was the longitudinal direction of the measurement sample. At this time, the distance between the chucks was 20 mm, and the measurement sample was adjusted and fixed so as not to slack and not to be excessively pulled. Then, while applying a tensile load (static load), vibrations at a frequency of 1 Hz were applied, the dynamic mechanical analysis was carried out in a range of −50° C. or more and 200° C. or less, and the tensile storage elastic modulus E', the tensile loss elastic modulus E" and the tensile loss tangent tan δ of the impact absorbing layer were measured at respective temperatures. The temperature at which the tensile loss tangent tan δ peaks within a range of −50° C. or more and 200° C. or less, was regarded as the glass transition temperature of the impact absorbing layer. As the dynamic mechanical analyzing device, a Rheogel-E4000 from UBM Corporation was used. The measurement conditions were as follows. The results are shown in Table 1.

(Measurement Conditions of Glass Transition Temperature)

- Measurement sample: 40 mm×5 mm rectangle
- Measuring jig: pull
- Distance between chucks (measurement sample length between chucks): 20 mm
- Measurement mode: temperature dependence (temperature range: −50° C. to 200° C., step temperature: 1° C., temperature rising rate: 2° C./min)

Distortion waveform: sine wave
Distortion control: automatic adjustment
Frequency: 1 Hz (continuous vibration applying)
Static load control: 50 g (constant static load); however, when the distance between chucks was extended by 2 mm or more at the time of load application, the load was reduced to 10 g (constant static load) or 5 g (constant static load).

b) A Layer and B Layer

For the A layer and the B layer constituting the front panel in Examples and Comparative Examples, the glass transition temperature was measured by a method based on the peak-top value of the shear loss tangent (tan δ) (DMA method). Firstly, the A layer or the B layer was punched into a rectangular shape of 10 mm×5 mm to obtain a measurement sample. Then, two pieces of this measurement sample were prepared and installed into a solid shear jig of the dynamic mechanical analyzing device. Specifically, in the solid shear jig, three plates were provided in the vertical direction, that is, one metal inner plate having a thickness of 1 mm, and two L-shaped metal outer plates placed on both sides of the inner plate are provided; one of the measurement samples was sandwiched between the inner plate and one outer plate, and the other measurement sample was sandwiched between the inner plate and the other outer plate. Then, the solid shear jig was installed into a dynamic mechanical analyzing device at distance between chucks of 20 mm, and the dynamic mechanical analysis was carried out within a range of −50° C. or more and 200° C. or less, applying longitudinal vibrations with a strain amount of 1% and frequency of 1 Hz to the two outer plates while fixing the inner plate, and the shear storage elastic modulus G' was measured at respective temperatures. As the dynamic mechanical analyzing device, a Rheogel-E4000 from UBM Corporation was used. The measurement conditions were as follows. The results are shown in Table 1.

(Measurement Conditions of Glass Transition Temperature)
Measurement sample: 10 mm×5 mm rectangle (two samples)
Measuring jig: solid shear
Distortion waveform: sine wave
Distortion control: automatic adjustment
Frequency: 1 Hz
Measurement mode: temperature dependence (temperature range: −50° C. to 200° C., step temperature: 1° C., temperature rising rate: 2° C./min)

(4) Impact Test

An impact test was carried out for the front panels in Examples and Comparative Examples. Firstly, a PET substrate (product name "Cosmoshine (tradename) A4300" from Toyobo Co., Ltd.) having a thickness of 50 μm was adhered to the surface of the B layer of the front panel to obtain a stacked body for measurement. Then, an aluminum plate (A1N30H-H18 from Fukuda Metal Foil & Powder Co., Ltd.) having a thickness of 100 μm was placed on a stone plate having a smooth surface, and the stacked body for measurement was placed on the aluminum plate so that the surface of the PET substrate surface of the stacked body for measurement was in contact with the aluminum plate. Then, from the test height, a pen (Easy ELITE 5 g, pen tip φ0.7 mm from BIC Corporation) was dropped onto the front panel with its tip end down, and the concavity of the aluminum plate was measured using a white interferometric microscope (New View 7300 from Zygo Corporation). At this time, the drop point of the pen was observed under the following conditions, and the difference between the height of the deepest position and the height to be substantially flat was regarded as a concavity. Further, the maximum test height wherein the concavity of the aluminum plate was less than 6 μm, was evaluated. For the front panels in Examples 6 to 7 and Comparative Examples 7 to 8, a crack in the glass substrate was also observed, and the maximum test height wherein the glass substrate did not crack, was evaluated. The results are shown in Table 2 and Table 3.

Figure 8A:
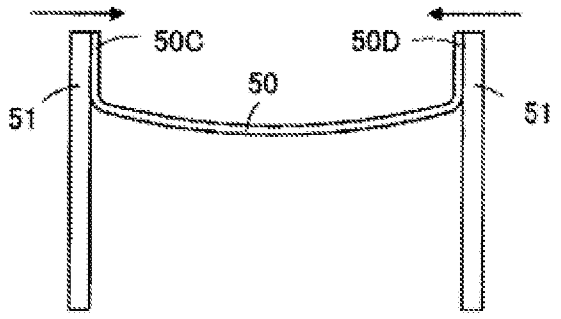
FIGS. 8A to 8C are schematic views explaining a consecutive folding test.
Figure 8B:
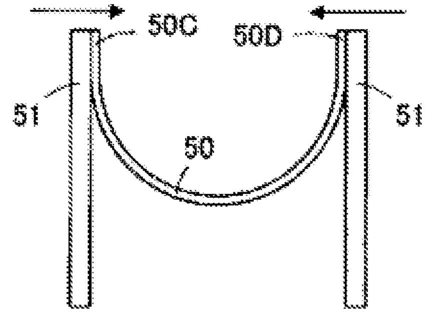
Figure 8C:
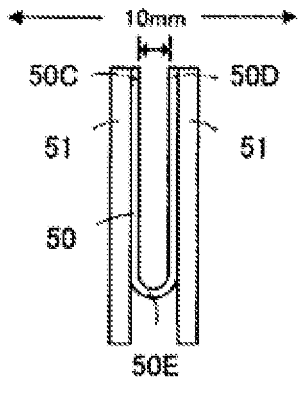

(Measurement Conditions of Concavity in Aluminum Plate)
Objective lens: 10 times
Acquisition Mode: scan
Scan Type: bipolar
Camera Mode: 992×992 48 Hz
Zoom: 0.5 times
Scan length: 20 μm bipolar (Analysis Conditions of Concavity in Aluminum Plate)
Remove: plane
Filter: off (5) Folding Resistance A consecutive folding test was carried out for the front panels in Examples and Comparative Examples, and the folding resistance was evaluated. Specifically, firstly, a measurement sample having a size of 30 mm×100 mm was cut out from the front panel. Then, as shown in FIG. 8A, two opposing short side portions 50C, 50D of front panel (measurement sample) 50 were respectively fixed by fixing portions 51 of a parallelly arranged folding resistance tester (such as product name "U-shaped folding tester DLDMLH-FS", IEC62715-6-1 compliant from Yuasa System Co., Ltd.), and the front panel (measurement sample) 50 was set so that the front panel (measurement sample) 50 was folded into a U-shape in the long side direction. Thereafter, as shown in FIGS. 8A to 8C, hundred thousand times of consecutive folding test folding the sample into 180° was carried out under the following conditions so that the smallest interval φ of the two opposing short side portions 50C, 50D of front panel (measurement sample) 50 was 10 mm, and the hard coating layer side of the front panel (measurement sample) 50 was inside, and whether deformation, cracking or breakage occurred in bent portion 50E of the front panel (measurement sample) 50, or not was examined. The consecutive folding test was respectively carried out under room temperature environment at room temperature (23° C.) and 50% relative humidity; and under low temperature environments of −20° C. and −40° C. The evaluation criteria were as follows.

A: in the consecutive folding test, no deformation, cracking or breakage occurred in the bent portion.
B: in the consecutive folding test, although a deformation of practically allowable level was confirmed in the bent portion, no cracking or breakage occurred.
C: in the consecutive folding test, although a deformation was clearly confirmed in the bent portion, no cracking or breakage occurred.
D: in the consecutive folding test, a crack or a breakage occurred in the bent portion.

TABLE 1

| | Tensile storage elastic modulus (MPa) | | Shear storage elastic modulus (MPa) | | Glass transition temperature (° C.) | | |
|---|---|---|---|---|---|---|---|
| | Substrate layer | Impact absorbing layer | A layer | B layer | Impact absorbing layer | A layer | B layer |
| Example. 1 | 7900 | 3590 | 5.3 | 5.3 | 120 | 13 | 13 |
| Example. 2 | 7900 | 710 | 5.3 | 5.3 | 95 | 13 | 13 |
| Example. 3 | 7400 | 710 | 5.3 | 5.3 | 95 | 13 | 13 |
| Example. 4 | 7900 | 710 | 13 | 13 | 95 | 6 | 6 |
| Example. 5 | 7900 | 300 | 5.3 | 5.3 | 53 | 13 | 13 |
| Comp. Ex. 1 | 7900 | Non | Non | 5.3 | Non | Non | 13 |
| Comp. Ex. 2 | 7900 | 7900 | 5.3 | 5.3 | 370 | 13 | 13 |
| Comp. Ex. 3 | 7900 | 160 | 5.3 | 5.3 | −20 | 13 | 13 |
| Comp. Ex. 4 | 7900 | 710 | Non | 5.3 | 95 | Non | 13 |
| Comp. Ex. 5 | 7900 | 50 | 5.3 | 5.3 | −30 | 13 | 13 |
| Comp. Ex. 6 | 7900 | 710 | 138 | 5.3 | 95 | 95 | 13 |
| Example. 6 | — | 3590 | 5.3 | 5.3 | 120 | 13 | 13 |
| Example. 7 | — | 710 | 5.3 | 5.3 | 95 | 13 | 13 |
| Comp. Ex. 7 | — | Non | Non | 5.3 | Non | Non | 13 |
| Comp. Ex. 8 | — | 160 | 5.3 | 5.3 | −20 | 13 | 13 |
| Example. 8 | 7900 | 3590 | 15 | 15 | 120 | 60 | 60 |
| Example. 9 | 7900 | 710 | 15 | 15 | 95 | 60 | 60 |
| Example. 10 | 7900 | 300 | 15 | 15 | 53 | 60 | 60 |

TABLE 2

| | | Ex. 1 | Ex. 2 | Ex. 3 | Ex. 4 | Ex. 5 | Ex. 8 | Ex. 9 | Ex. 10 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|---|---|---|---|
| Maximum test height wherein concavity is less than 6 μm (cm) | | 20 | >25 | 25 | >25 | 25 | 20 | >25 | 25 | 5 | 7 | 25 | 7 | 14 | 16 |
| Folding resistance | Room temp. (23° C.) | A | A | A | A | A | A | A | A | A | A | A | A | A | A |
| | Low temp. (−20° C.) | A | A | A | A | A | A | A | A | A | A | D | A | A | A |
| | Low temp. (−40° C.) | B | B | B | B | B | A | A | A | B | B | D | B | B | B |

TABLE 3

| | Example. 6 | Example. 7 | Comp. Ex. 7 | Comp. Ex. 8 |
|---|---|---|---|---|
| Maximum test height wherein concavity is less than 6 μm (cm) | 33 | 45 | 16 | 45 |
| Maximum test height wherein glass does not crack (cm) | 30 | 28 | 40 | 20 |

The tensile storage elastic modulus of the impact absorbing layer and the shear storage elastic modulus of the A layer and the B layer of the front panels in Examples 1 to 7 were within a predetermined range, and since the impact absorbing layer was placed between the A layer and the B layer softer than the impact absorbing layer, the impact resistance was excellent. Also, since the glass transition temperatures of the A layer and the B layer were high in Examples 8 to 10, the folding resistance at −40° C. was excellent.

Meanwhile, since the front panels in Comparative Example 1 and 7 were not provided with an impact absorbing layer, the impact resistance was inferior.

Since the tensile storage elastic modulus of the impact absorbing layer of the front panel in Comparative Example 2 was high, the impact resistance was inferior. Since the impact absorbing layer was placed directly on the polyimide substrate of the front panel in Comparative Example 4, the impact resistance was inferior. Since the tensile storage elastic modulus of the impact absorbing layer of the front panel in Comparative Example 5 was low, the impact resistance was not sufficient. Since the shear storage elastic modulus of the A layer of the front panel in Comparative Example 6 was high, the impact resistance was not sufficient. Also, since the glass transition temperature of the impact absorbing layer of the front panel in Comparative Example 3 was low, the folding resistance under low temperature environment was inferior. Since the glass transition temperature of the impact absorbing layer of the front panel in Comparative Example 8 was also low, it is believed that the folding resistance under low temperature environment was inferior, similar to Comparative Example 3.

REFERENCE SIGNS LIST

1: front panel for a display device
2: substrate layer
3: A layer
4: impact absorbing layer
5: B layer
6: hard coating layer

7: scattering prevention layer
10: stacked body for a display device
20: display device
21: display panel
30: flexible organic EL display device
31: organic EL display panel
40: stacked body

The invention claimed is:

1. A flexible organic electroluminescence display device comprising:

an organic electroluminescence display panel; and a front panel for a display device placed on an observer side of the organic electroluminescence display panel and comprising a substrate layer, an A layer, an impact absorbing layer, and a B layer, in this order, wherein the substrate layer is a resin substrate having a thickness of 10 μm or more and 100 μm or less or the substrate layer is a glass substrate having a thickness of 15 μm or more and 200 μm or less, a thickness of the A layer is 10 μm or more and 100 μm or less, a shear storage elastic modulus of each of the A layer and the B layer, at frequency of 950 Hz and temperature of 23° C., is 20 MPa or less, and in the impact absorbing layer, a tensile storage elastic modulus at frequency of 950 Hz and temperature of 23°

C. is 200 MPa or more and 5000 MPa or less, and a glass transition temperature is 80° C. or more and 200° C. or less.

2. The flexible organic electroluminescence display device according to claim 1, wherein a ratio of a tensile storage elastic modulus of the substrate layer at frequency of 950 Hz and temperature of 23° C., with respect to the tensile storage elastic modulus of the impact absorbing layer is 1.5 or more.

3. The flexible organic electroluminescence display device according to claim 1, wherein the substrate layer is a polyimide based resin substrate having a thickness of 10 μm or more and 100 μm or less.

4. The flexible organic electroluminescence display device according to claim 1, wherein the impact absorbing layer includes a urethane based resin or a polyethylene terephthalate based resin.

5. The flexible organic electroluminescent display device according to claim 1, which is configured to be foldable or rollable.

6. The flexible organic electroluminescence display device according to claim 1, wherein the substrate layer is on an observer side of the display device relative to the A layer.

7. The flexible organic electroluminescence display device according to claim 1, wherein the substrate layer is a glass substrate with a thickness of 15 μm or more and 100 μm or less.

* * * * *